United States Patent
Liaw

(10) Patent No.: US 9,424,889 B1
(45) Date of Patent: Aug. 23, 2016

(54) MULTIPLE-PORT SRAM DEVICE

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 14/613,686

(22) Filed: Feb. 4, 2015

(51) Int. Cl.
*G11C 8/16* (2006.01)
*G11C 5/06* (2006.01)
*G11C 11/412* (2006.01)

(52) U.S. Cl.
CPC ............... *G11C 5/06* (2013.01); *G11C 11/412* (2013.01)

(58) Field of Classification Search
CPC ....................................................... G11C 8/16
USPC ......................................................... 365/154
See application file for complete search history.

(56) References Cited

U.S. PATENT DOCUMENTS

| | | | |
|---|---|---|---|
| 7,092,279 B1* | 8/2006 | Sheppard | G11C 7/02 257/E21.656 |
| 7,626,854 B1 | 12/2009 | Yang et al. | |
| 7,940,542 B2* | 5/2011 | Funane | G11C 8/16 365/189.14 |
| 8,421,205 B2 | 4/2013 | Yang | |
| 8,625,334 B2* | 1/2014 | Liaw | H01L 27/1104 365/154 |
| 8,661,389 B2 | 2/2014 | Chern et al. | |
| 8,675,397 B2* | 3/2014 | Liaw | G11C 8/16 365/154 |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 8,976,573 B2* | 3/2015 | Liaw | G11C 8/14 365/154 |
| 2011/0068400 A1* | 3/2011 | Wang | G11C 11/412 257/347 |
| 2011/0078414 A1* | 3/2011 | Olson | G06F 9/3012 712/208 |
| 2013/0021839 A1* | 1/2013 | Ishikura | G11C 11/412 365/154 |
| 2013/0026580 A1* | 1/2013 | Morimoto | H01L 27/0207 257/369 |
| 2013/0077375 A1* | 3/2013 | Liaw | H01L 27/0207 365/72 |
| 2013/0154027 A1* | 6/2013 | Liaw | H01L 27/1104 257/390 |
| 2013/0170275 A1* | 7/2013 | Kumar | G11C 11/412 365/63 |
| 2014/0215420 A1 | 7/2014 | Lin et al. | |
| 2014/0264924 A1 | 9/2014 | Yu et al. | |
| 2014/0282289 A1 | 9/2014 | Hsu et al. | |
| 2014/0325466 A1 | 10/2014 | Ke et al. | |

* cited by examiner

*Primary Examiner* — Min Huang
(74) *Attorney, Agent, or Firm* — Slater Matsil, LLP

(57) ABSTRACT

A multiple-port memory cell includes first conductive lines in a first metal layer, second conductive lines in a second metal layer, third conductive lines a third metal layer, and fourth conductive lines in a fourth metal layer. The first conductive lines include a write bit line electrically coupled with a write bit line node; a first read bit line electrically coupled with a first read bit line node; and a second read bit line electrically coupled with a second read bit line node. The second conductive lines include a write word line electrically coupled with a write word line node. The fourth conductive lines include a first read word line electrically coupled with a first read word line node; and a second read word line electrically coupled with a second read word line node.

20 Claims, 24 Drawing Sheets

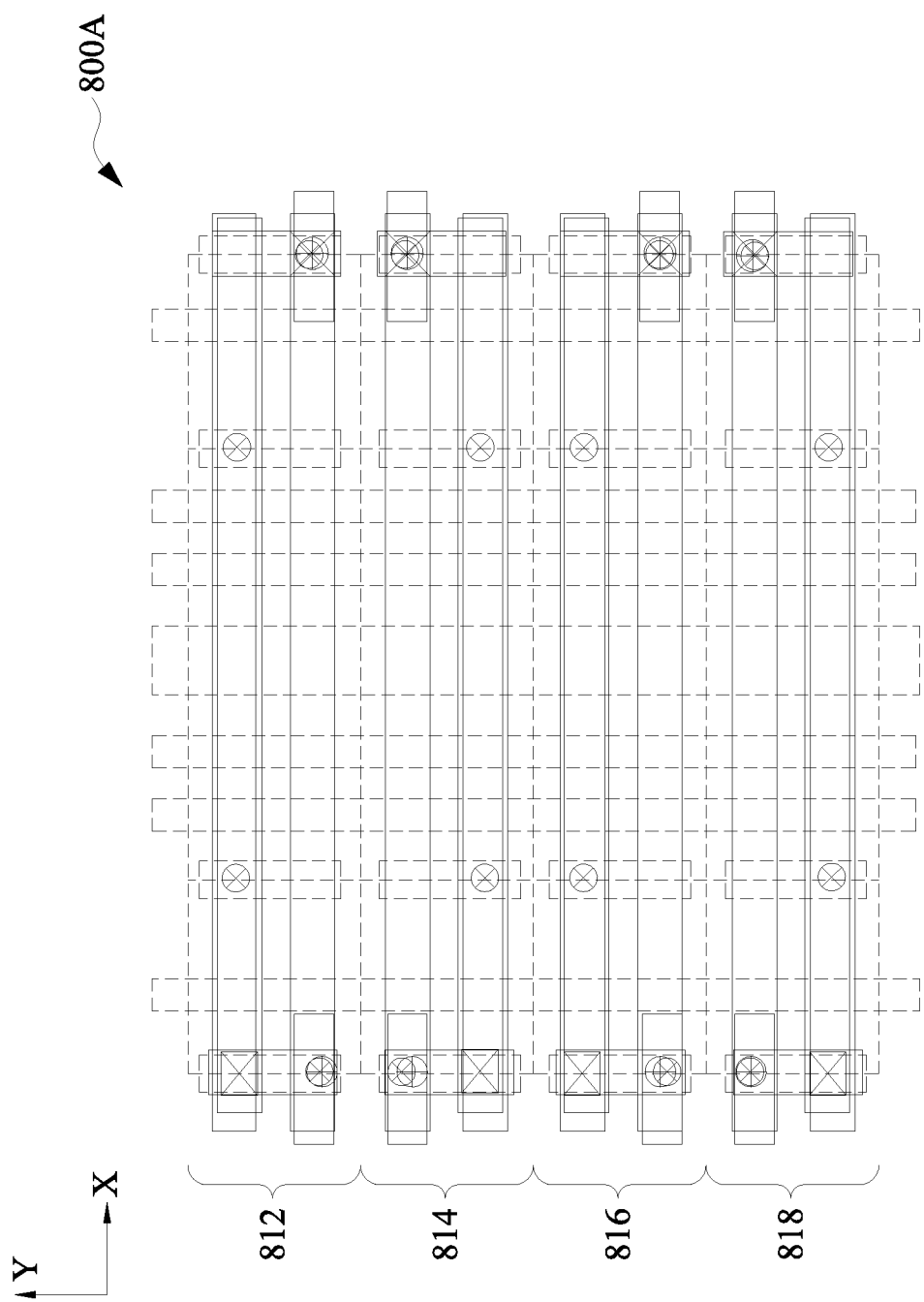

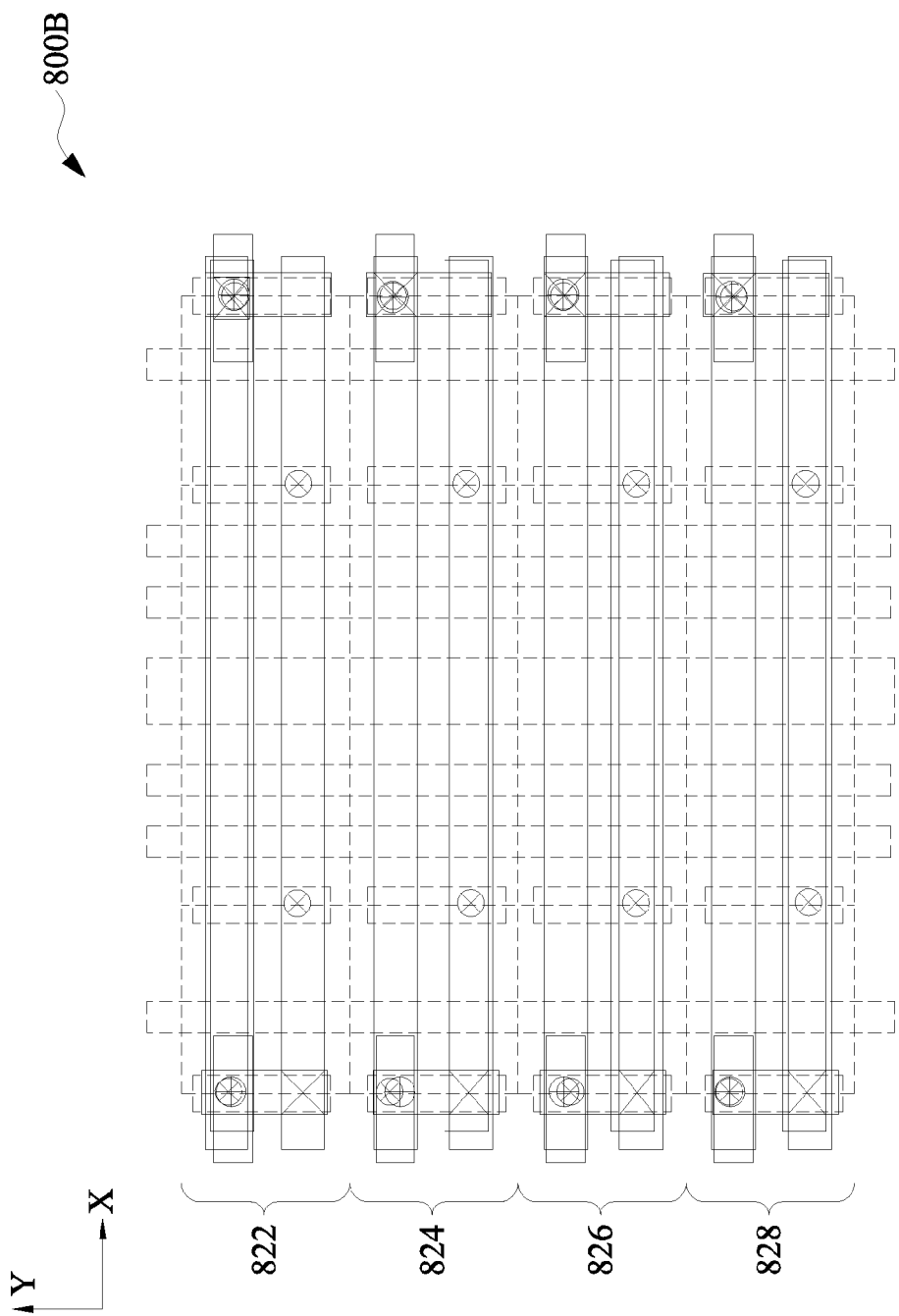

MULTIPLE-PORT SRAM DEVICE

RELATED APPLICATIONS

The instant application is related to U.S. patent application titled "DUAL-PORT SRAM CONNECTION STRUCTURE," filed on Jan. 2, 2013, U.S. application Ser. No. 13/732,980, and U.S. patent application titled "MULTIPLE-PORT SRAM DEVICE," filed on Nov. 29, 2006, U.S. application Ser. No. 11/605,757, now U.S. Pat. No. 7,525,868. The entire contents of the above-referenced applications are incorporated by reference herein.

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. In some embodiments, an SRAM device includes a plurality of multiple-port memory cells. A multiple-port memory cell includes a plurality of access ports configured for individually accessing a data node of the memory cell. In some applications, a memory device of multiple-port memory cells is capable of accessing two or more of its memory cells during a single clock cycle through various bit lines using different word line signals associated with different access ports. As ICs have become smaller and more complex, the layout of the memory cells of a memory device and its corresponding bit lines and word lines affect the performance of the memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A and 8B are top views of various memory devices, with all the depictions regarding components over a fourth metal layer of a chip omitted, in accordance with some embodiments.

DETAILED DESCRIPTION

Figure 1:
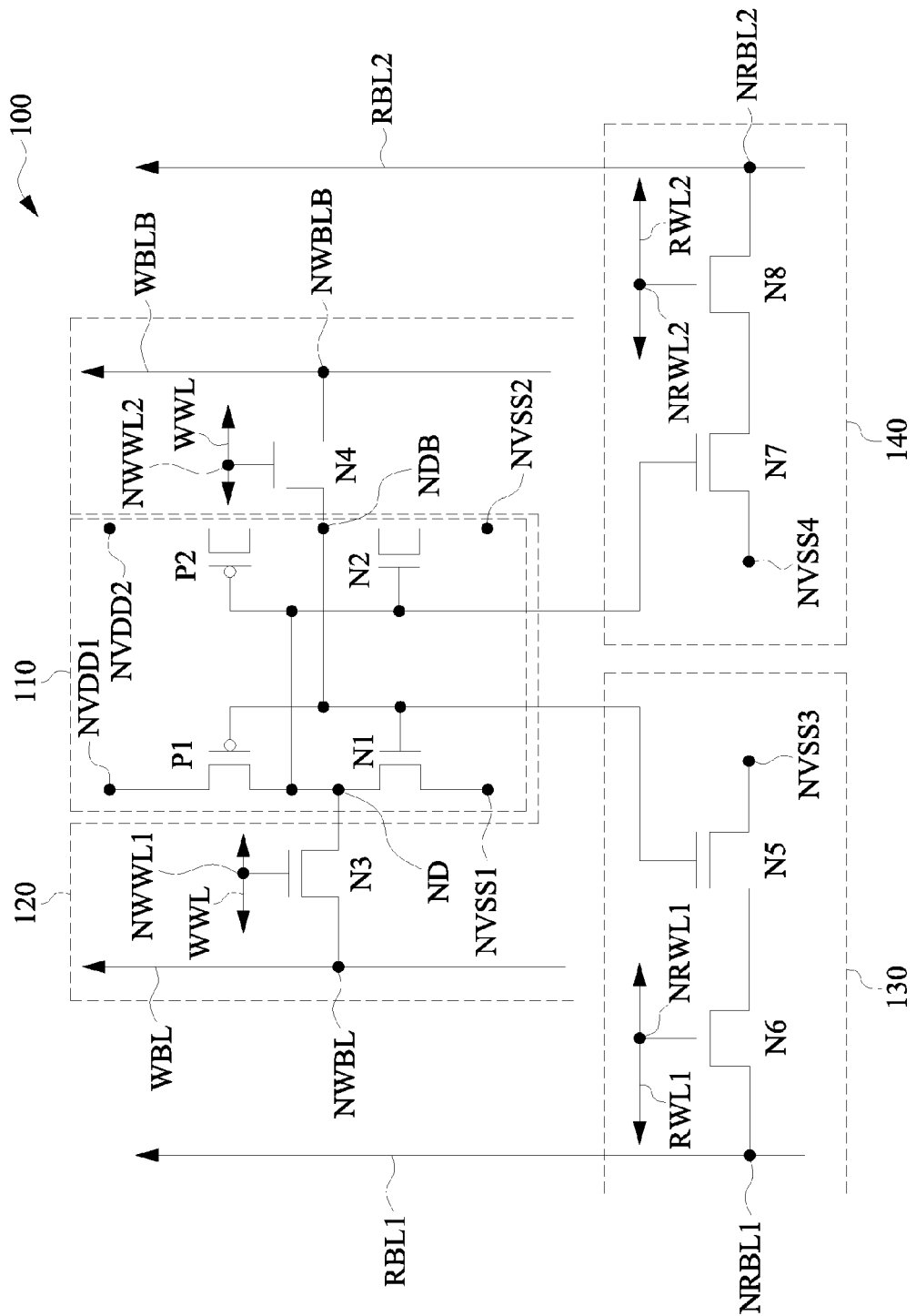
FIG. 1 is a schematic circuit diagram of a three-port static random access memory cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a multiple-port memory cell (also referred to as a memory device) includes bit lines in a first metal layer extending along a first direction, a write word line in a second metal layer extending along a second direction, one or more landing pads in a third metal layer, and two read word lines in a fourth metal layer extending along the second direction. In some embodiments, a ratio of a cell width to a cell height of a multiple-port memory cell in accordance with some embodiments of the present application is equal to or greater than 5.

FIG. 1 is a schematic circuit diagram of a three-port static random access memory cell 100 in accordance with some embodiments. Memory cell 100 includes a storage circuit 110 having data nodes ND and NDB, a write port circuit 120 coupled with data nodes ND and NDB, a first read port circuit 130 coupled with data node ND, and a second read port circuit 140 coupled with data node NDB.

Storage circuit 110 includes two P-type metal oxide semiconductor (PMOS) transistors P1 and P2 and two N-type metal oxide semiconductor (NMOS) transistors N1 and N2. Transistors P1, P2, N1, and N2 form a cross latch having two cross-coupled inverters. Transistors P1 and N1 form a first inverter while transistors P2 and N2 form a second inverter. Drains of transistors P1 and N1 are coupled together and form data node ND. Drains of transistors P2 and N2 are coupled together and form data node NDB. Gates of transistors P1 and N1 are coupled together and to drains of transistors P2 and N2. Gates of transistors P2 and N2 are coupled together and to drains of transistors P1 and N1. Source of transistor P1 is coupled with a supply voltage node NVDD1. Source of transistor P2 is coupled with a supply voltage node NVDD2. In some embodiments, supply voltage nodes NVDD1 and NVDD2 are electrically coupled together and configured to receive a supply voltage VDD. Source of transistor N1 is coupled with a reference voltage node NVSS1, and source of transistor N2 is coupled with a reference voltage node NVSS2. In some embodiments, reference voltage node NVSS1 and reference voltage node NVSS2 are electrically coupled together and configured to receive a reference voltage VSS.

Write port circuit 120 includes two NMOS transistors N3 and N4. Transistor N3 functions as a pass gate between data node ND and a write bit line WBL, and transistor N4 functions as a pass gate between data node NDB and a write bit line WBLB. A drain of transistor N3 is referred to as a write bit line node NWBL and electrically coupled with write bit line WBL. A source of transistor N3 is electrically coupled with data node ND. A drain of transistor N4 is referred to as a write bit line node NWBLB and electrically coupled with write bit line WBLB. A source of transistor N4 is electrically coupled with data node NDB. A gate of transistor N3 is referred to as a write word line node NWWL1, a gate of transistor N4 is referred to as a write word line node NWWL2, and write word line nodes NWWL1 and NWWL2 are electrically coupled with a write word line WWL.

In some embodiments, in a memory array having a plurality of memory cells each having a configuration the same as memory cell 100, write bit lines WBLB and WBL are coupled to each drain of transistors N3 and N4 of memory cells in a column of the memory array, and write word line WWL is coupled to each gate of transistors N3 and N4 of memory cells in a row of the memory array.

In a write operation of memory cell 100 using write port circuit 120, data to be written to memory cell 100 is applied to write bit lines WBL and WBLB. Write word line WWL is then activated to turn on transistors N3 and N4. As a result, the data on bit lines WBL and WBLB is transferred to and is stored in corresponding nodes ND and NDB.

Read port circuit 130 includes two NMOS transistors N5 and N6. A source of transistor N5 is coupled with a reference voltage node NVSS3. In some embodiments, reference voltage node NVSS3 is configured to receive the reference voltage VSS. A gate of transistor N5 is coupled with data node NDB. A drain of transistor N5 is coupled with a source of transistor N6. A drain of transistor N6 is referred to as a first read bit line node NRBL1 and electrically coupled with a first read bit line RBL1. A gate of transistor N6 is referred to as a first read word line node NRWL1 and electrically coupled with a first read word line RWL1.

In a read operation of memory cell 100 using read port circuit 130, read bit line RBL1 is pre-charged with a high logical value. Read word line RWL1 is activated with a high logical value to turn on transistor N6. The data stored in node NDB turns on or off transistor N5. For example, if node NDB stores a high logical value, transistor N5 is turned on. The turned-on transistors N6 and N5 then pull read bit line RBL1 to reference voltage VSS or a low logical value at the source of transistor N5. On the other hand, if node NDB stores a low logical value, transistor N5 is turned off and operates as an open circuit. As a result, read bit line RBL1 remains at the pre-charged high logical value. Detecting a logical value on read bit line RBL1 therefore reveals the logical value stored in node NDB.

Read port circuit 140 includes two NMOS transistors N7 and N8. A source of transistor N7 is coupled with a reference voltage node NVSS4. In some embodiments, reference voltage node NVSS4 is configured to receive the reference voltage VSS. A gate of transistor N7 is coupled with data node ND. A drain of transistor N7 is coupled with a source of transistor N8. A drain of transistor N8 is referred to as a second read bit line node NRBL2 and electrically coupled with a second read bit line RBL2. A gate of transistor N8 is referred to as a second read word line node NRWL2 and electrically coupled with a second read word line RWL2.

A read operation of memory cell 100 using read port circuit 140 is performed in a manner similar to performing a read operation of memory cell 100 using read port circuit 130, and the detailed description thereof is thus omitted. As a result, if node ND stores a high logical value, read bit line RBL2 is pulled to reference voltage VSS or a low logical value at the source of transistor N7. On the other hand, if node ND stores a low logical value, read bit line RBL2 remains at the pre-charged high logical value. Detecting a logical value on read bit line RBL2 therefore reveals the logical value stored in node ND.

Memory cell 100 is illustrated as an example. In some embodiments, the present application is applicable to a multiple-port SRAM cell having one or more write ports and/or one or more read ports.

Figure 2:
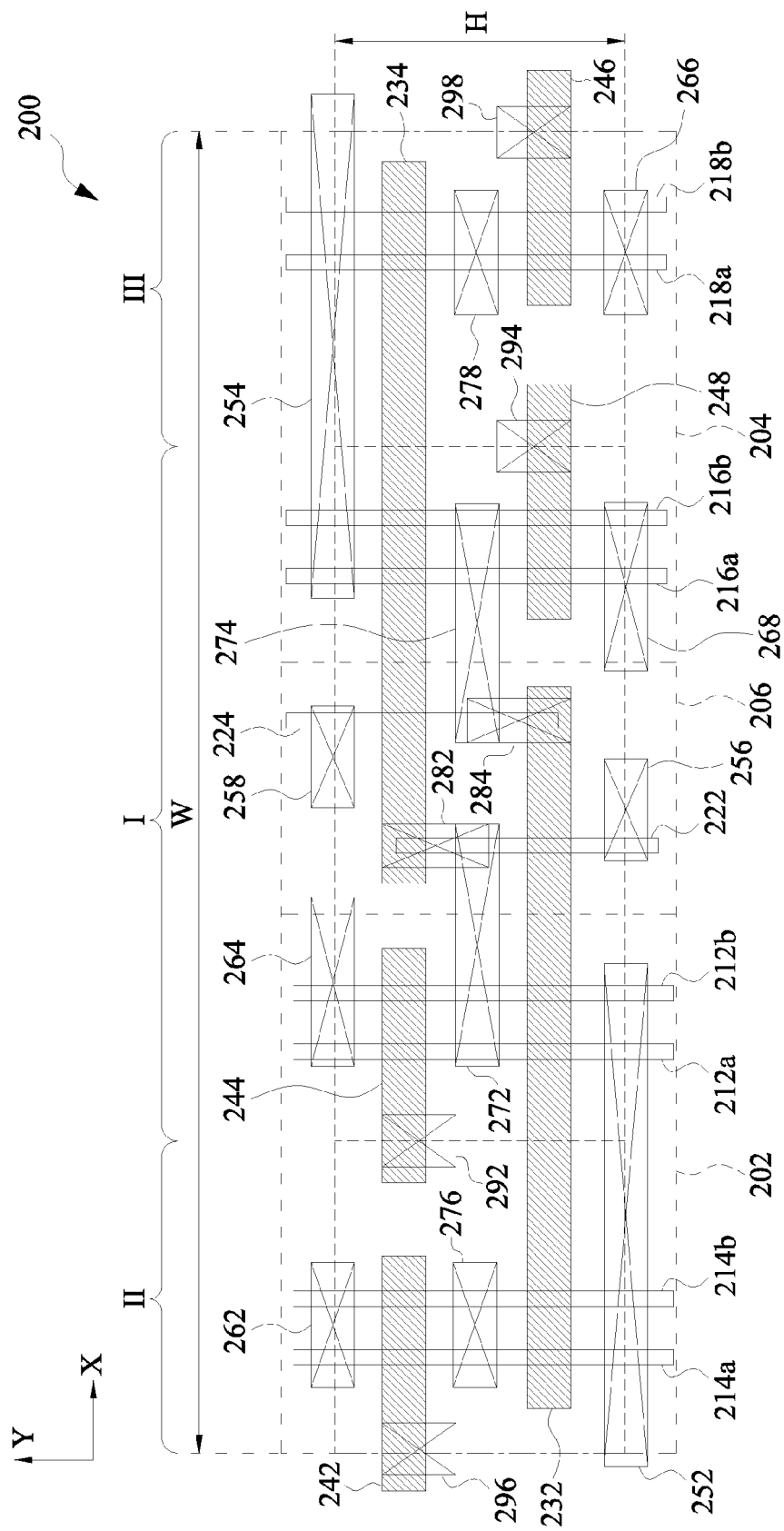
FIG. 2 is a top view of a memory cell, with all the depictions regarding components in and above a first metal layer of a chip omitted, in accordance with some embodiments.

FIG. 2 is a top view of a memory cell 200 in a chip, with all the depictions regarding components in and above a first metal layer of the chip omitted, in accordance with some embodiments. Moreover, the depictions regarding via plugs connecting various components depicted in FIG. 2 and the first metal layer are omitted. The first metal layer of the chip will be further illustrated in conjunction with FIG. 6. In some embodiments, memory cell 200 is an implementation of memory cell 100 depicted in FIG. 1. Some components of memory cell 200 are not shown in FIG. 2 for clarity of FIG. 2.

Memory cell 200 includes a substrate (not labeled) having P-well regions 202 and 204 and an N-well region 206. Memory cell 200 includes a plurality of active structures 212a, 212b, 214a, 214b, 216a, 216b, 218a, 218b, 222, and 224 extending along a first direction X; a plurality of gate structures 232, 234, 242, 244, 246, and 248 extending along a second direction Y; a plurality of active contact structures 252, 254, 256, 258, 262, 264, 266, 268, 272, 274, 276, and 278; and a plurality of gate contact structures 282, 284, 292, 294, 296, and 298.

Active structures 212a, 212b, 214a, and 214b are in P-well region 202 for forming NMOS transistors. Active structures 216a, 216b, 218a, and 218b are in P-well region 204 forming NMOS transistors. Active structures 222 and 224 are in N-well region 206 forming PMOS transistors. Active structures 212a-224 are semiconductor fins formed on the substrate. The number of fins for each transistor depicted in FIG. 2 is provided as an example. In some embodiments, any number of fins are within the scope of various embodiments. In some embodiments, active structures 212a-224 are integrally formed with the substrate.

Transistors P1, P2, N1, N2, N3, and N4 (FIG. 1) are formed within an area I, which is also referred to as a storage/write port area of memory cell 200.

Gate structure 232 overlaps active structure 222 and functions as a gate of transistor P1. Active contact structures 256 and 272 overlap active structure 222 and correspond to a source and a drain of transistor P1. Gate structure 234 overlaps active structure 224 and functions as a gate of transistor P2. Active contact structures 258 and 274 overlap active structure 224 and correspond to a source and a drain of transistor P2. Gate contact structure 282 connects gate structure 234 and active contact structures 272. Gate contact structure 284 connects gate structure 232 and active contact structures 274. Gate structure 232 overlaps active structures 212a and 212b and functions as a gate of transistor N1. Active contact structures 252 and 272 overlap active structures 212a and 212b and correspond to a source and a drain of transistor N1. Gate structure 234 overlaps active structures 216a and 216b and functions as a gate of transistor N2. Active contact structures 254 and 274 overlap active structures 216a and 216b and correspond to a source and a drain of transistor N2.

Accordingly, active contact structure 256 corresponds to node NVDD1; active contact structure 258 corresponds to node NVDD2, active contact structure 252 corresponds to node NVSS1; and active contact structure 254 corresponds to node NVSS2.

Gate structure 244 overlaps active structures 212a and 212b and functions as a gate of transistor N3. Active contact structures 272 and 264 overlap active structures 212a and 212b and correspond to a source and a drain of transistor N3. Gate contact structure 292 contacts gate structure 244 and functions as a landing pad for gate structure 244. Gate structure 248 overlaps active structures 216a and 216b and functions as a gate of transistor N4. Active contact structures 274 and 268 overlap active structures 216a and 216b and correspond to a source and a drain of transistor N4. Gate contact structure 294 contacts gate structure 248 and functions as a landing pad for gate structure 248.

Accordingly, active contact structure 264 corresponds to node NWBL; active contact structure 268 corresponds to node NWBLB, gate contact structure 292 corresponds to node NWWL1; and gate contact structure 294 corresponds to node NWWL2.

Transistors N5 and N6 are formed within an area II, which is also referred to as a first read port area of memory cell 200.

Gate structure 232 overlaps active structures 214a and 214b and functions as a gate of transistor N5. Active contact structures 252 and 276 overlap active structures 214a and 214b and correspond to a source and a drain of transistor N5. Gate structure 242 overlaps active structures 214a and 214b and functions as a gate of transistor N6. Active contact structures 276 and 262 overlap active structures 214a and 214b and correspond to a source and a drain of transistor N6. Gate contact structure 296 contacts gate structure 242 and functions as a landing pad for gate structure 242.

Accordingly, active contact structure 262 corresponds to node NRBL1; gate contact structure 296 corresponds to node NRWL1, and active contact structure 252 also corresponds to node NVSS3.

Transistors N7 and N8 are formed within an area III, which is also referred to as a second read port area of memory cell 200.

Gate structure 234 overlaps active structures 218a and 218b and functions as a gate of transistor N7. Active contact structures 254 and 278 overlap active structures 218a and 218b and correspond to a source and a drain of transistor N7. Gate structure 246 overlaps active structures 218a and 218b and functions as a gate of transistor N8. Active contact structures 278 and 266 overlap active structures 218a and 218b and correspond to a source and a drain of transistor N8. Gate contact structure 298 contacts gate structure 246 and functions as a landing pad for gate structure 246.

Accordingly, active contact structure 266 corresponds to node NRBL2; gate contact structure 298 corresponds to node NRWL2, and active contact structure 254 also corresponds to node NVSS4.

Areas I, II, and III together define an area occupied by memory cell 200 and the cell boundaries thereof. Memory cell 200 has a cell width W measurable along direction X and a cell height H measurable along direction Y. In some applications, a memory macro is formed but repeating and abutting memory cells having a configuration identical or mirrored-identical to memory cell 200, and thus cell width W is also referred to as a cell pitch along direction X, and cell height H is also referred to as a cell pitch along direction Y. In some embodiments, a ratio of cell width W to cell height H is equal to or greater than 5.

Figure 3A:
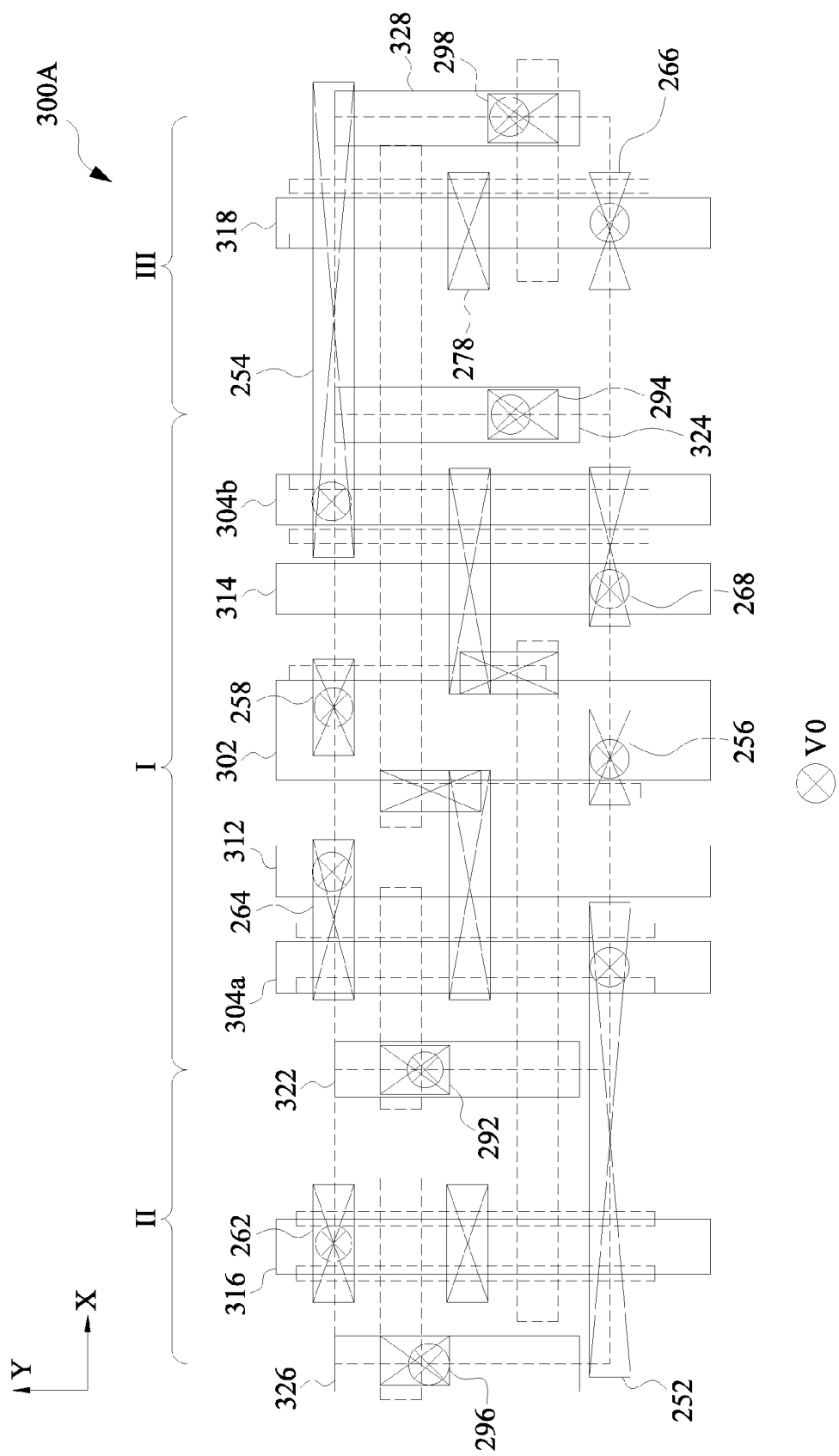
FIGS. 3A-3C are top views of various memory cells, with all the depictions regarding components over a first metal layer of a chip omitted, in accordance with some embodiments.

FIG. 3A is a top view of a memory cell 300A, with all the depictions regarding components over a first metal layer of a chip omitted, in accordance with some embodiments. The components in memory cell 300A that are the same or similar to those in memory cell 200 are given the same reference numbers, and detailed description thereof is thus omitted. Some components of memory cell 300A that are the same or similar to those in memory cell 200 are omitted in FIG. 3A, or depicted in dotted lines, or not labeled for clarity of FIG. 3A. In some embodiments, memory cell 300A is an implementation of memory cell 100 depicted in FIG. 1 having components as depicted in FIG. 2.

Memory cell 300A includes a plurality of conductive lines 302, 304a, 304b, 312, 314, 316, and 318. Conductive lines 302-318 extend along direction Y in a first metal layer of a chip in which memory cell 300A is formed. Memory cell 300A further includes a plurality of via plugs V0 connecting conductive lines of the first metal layer with corresponding active contact structures 252-268 and gate contact structures 292-298. In some embodiments, one or more via plugs V0 are omitted. As a result, conductive lines 302-318 are in contact with corresponding active contact structures 252-268 and gate contact structures 292-298.

Conductive lines 302-314 overlap storage/write port area I. Conductive line 302 is a supply voltage line electrically coupled with active contact structures 256 and 258, which correspond to supply voltage nodes NVDD1 and NVDD2. Conductive line 304a is a reference voltage line electrically coupled with active contact structure 252, which corresponds to reference voltage nodes NVSS1 and NVSS3. Conductive line 304b is a reference voltage line electrically coupled with active contact structure 254, which corresponds to reference voltage nodes NVSS2 and NVSS4. Conductive lines 304a and 304b are placed symmetrically about conductive line 302. Conductive line 312 is a first write bit line electrically coupled with active contact structure 264, which corresponds to write bit line node NWBL. Conductive line 314 is a second write bit line electrically coupled with active contact structure 268, which corresponds to write bit line node NWBLB. In some embodiments, conductive line 312 corresponds to write bit line WBL in FIG. 1, and conductive line 314 corresponds to write bit line WBLB. Conductive lines 312 and 314 are also placed symmetrically about conductive line 302.

Conductive line 316 overlaps first read port area II. Conductive line 316 is a first read bit line electrically coupled with active contact structure 262, which corresponds to read bit line node NRBL1. Conductive line 318 overlaps second read port area III. Conductive line 318 is a second read bit line electrically coupled with active contact structure 266, which corresponds to read bit line node NRBL2. In some embodiments, conductive line 316 corresponds to read bit line RBL1 in FIG. 1, and conductive line 318 corresponds to read bit line RBL2. Conductive lines 316 and 318 are placed symmetrically about conductive line 302.

In some embodiments, when two or more memory cells having a configuration of memory cell 300A are abutted along direction Y, the conductive lines corresponding to conductive lines 302-318 are extended or merged accordingly.

Conductive line 322 overlaps storage/write port area I and first read port area II. Conductive line 322 is a first write word line landing pad electrically coupled with gate contact structure 292, which corresponds to write word line node NWWL1. Conductive line 324 overlaps storage/write port area I and second read port area III. Conductive line 324 is a second write word line landing pad electrically coupled with gate contact structure 294, which corresponds to write word line node NWWL2. Conductive lines 322 and 324 are placed symmetrically about conductive line 302.

Conductive line 326 overlaps first read port area II. Conductive line 326 is a first read word line landing pad electrically coupled with gate contact structure 296, which corresponds to read word line node NRWL1. Conductive line 328 overlaps second read port area III. Conductive line 328 is a second read word line landing pad electrically coupled with gate contact structure 298, which corresponds to read word line node NRWL2. Conductive lines 326 and 328 are also placed symmetrically about conductive line 302.

Figure 3B:
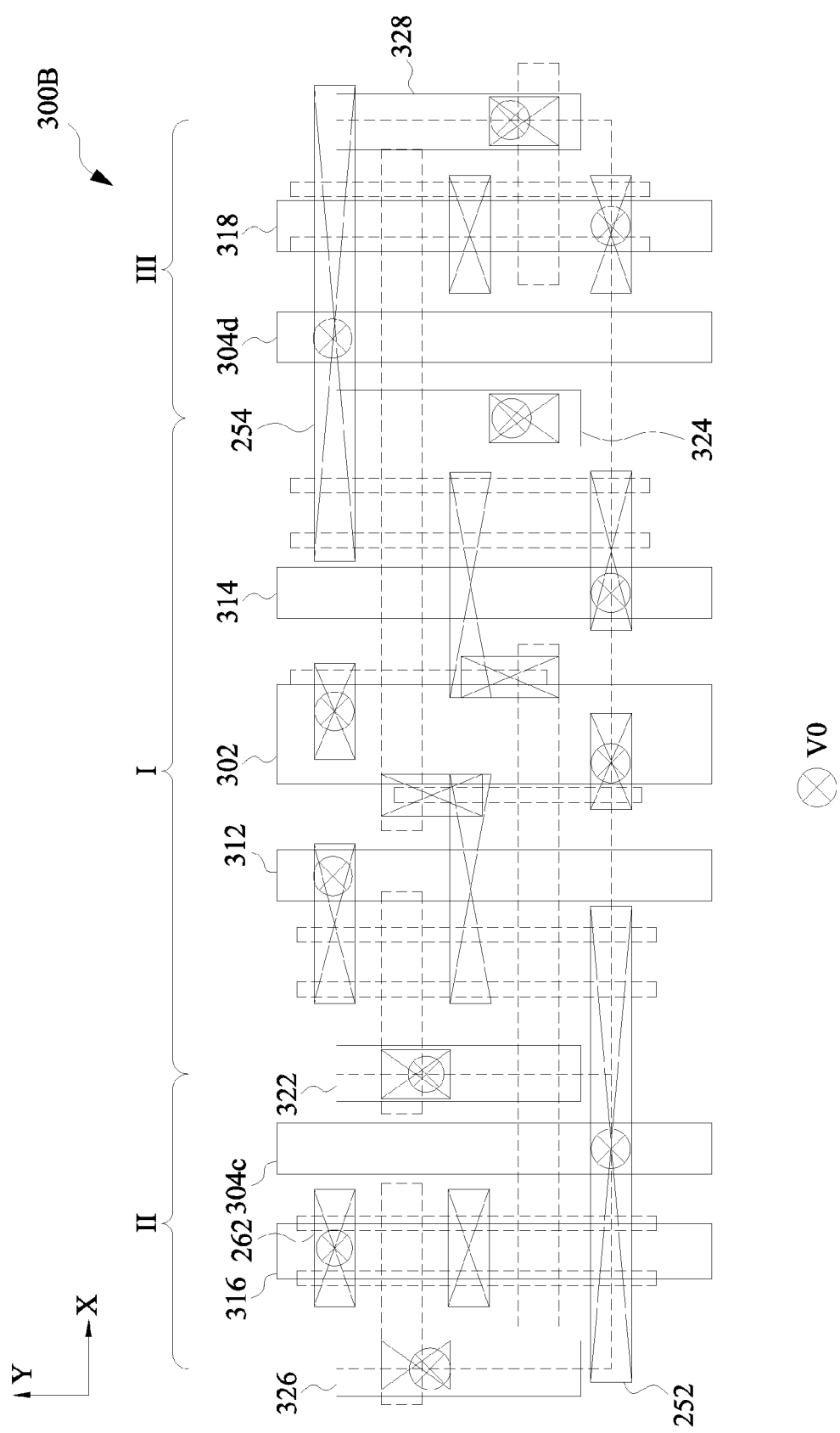

FIG. 3B is a top view of a memory cell 300B, with all the depictions regarding components over a first metal layer of a chip omitted, in accordance with some embodiments. Components in memory cell 300B that are the same or similar to those in memory cell 300A are given the same reference numbers, and detailed description thereof is thus omitted. Some components of memory cell 300B that are the same or similar to those in memory cell 300A are not labeled for clarity of FIG. 3B. In some embodiments, memory cell 300B is an implementation of memory cell 100 depicted in FIG. 1 having components as depicted in FIG. 2.

Compared with memory cell 300A, memory cell 300B includes conductive lines 304c and 304d in place of conductive line 304a and 304b. Conductive line 304c overlaps first read port area II. Conductive line 304c is a reference voltage line electrically coupled with active contact structure 252, which corresponds to reference voltage nodes NVSS1 and NVSS3. Conductive line 304d overlaps second read port area III. Conductive line 304d is a reference voltage line electrically coupled with active contact structure 254, which corresponds to reference voltage nodes NVSS2 and NVSS4. Conductive lines 304c and 304d are placed symmetrically about conductive line 302.

In some embodiments, when two or more memory cells having a configuration of memory cell 300B are abutted along direction Y, the conductive lines corresponding to conductive lines 304c and 304d are also extended or merged accordingly.

Figure 3C:
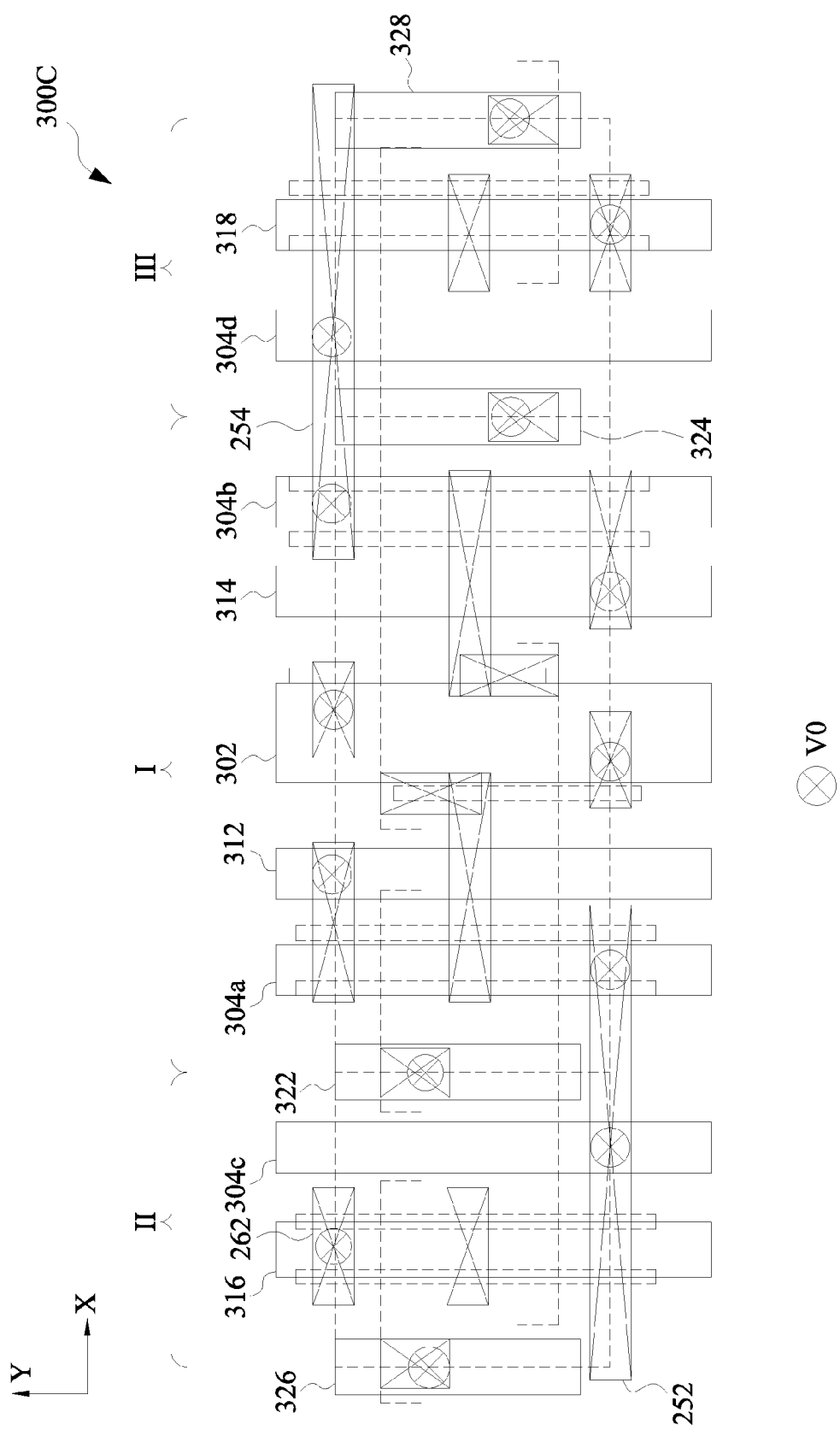

FIG. 3C is a top view of a memory cell 300C, with all the depictions regarding components over a first metal layer of a chip omitted, in accordance with some embodiments. Components in memory cell 300C that are the same or similar to those in memory cell 300A and memory cell 300B are given the same reference numbers, and detailed description thereof is thus omitted. Some components of memory cell 300C that are the same or similar to those in memory cells 300A and 300B are not labeled for clarity of FIG. 3C. In some embodiments, memory cell 300C is an implementation of memory cell 100 depicted in FIG. 1 having components as depicted in FIG. 2.

Compared with memory cell 300A and memory cell 300B, memory cell 300C includes all conductive lines 304a, 304b, 304c, and 304d as reference voltage lines.

Figure 4A:
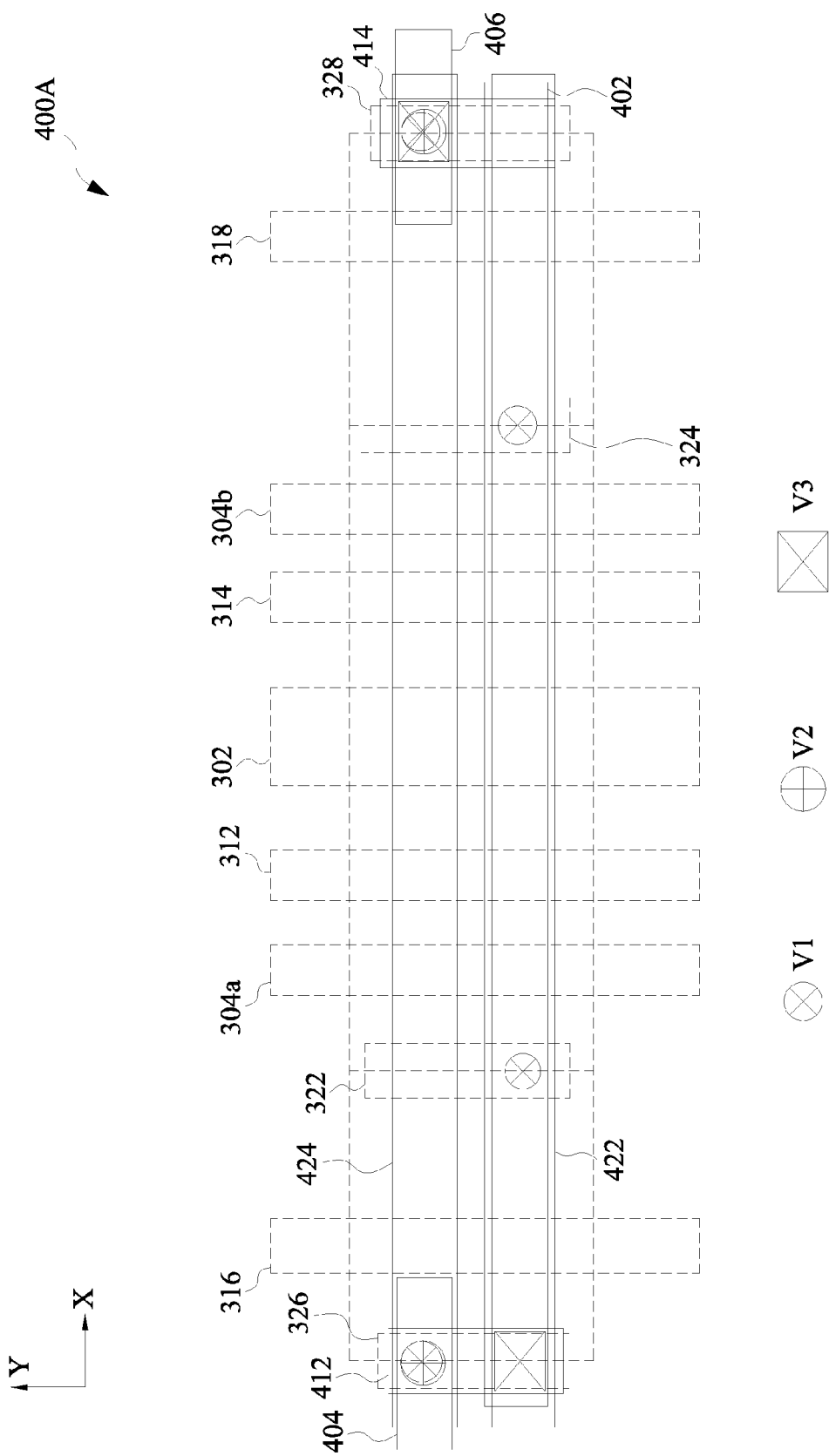
FIGS. 4A-4D are top views of various memory cells, with all the depictions regarding components over a fourth metal layer of a chip omitted, in accordance with some embodiments.

FIG. 4A is a top view of a memory cell 400A, with all the depictions regarding components over a fourth metal layer of a chip omitted, in accordance with some embodiments. The components in memory cell 400A that are the same or similar to those in memory cell 300A are given the same reference numbers, and detailed description thereof is thus omitted. Some components of memory cell 400A that are the same or similar to those in memory cell 300A are omitted in FIG. 4A, or depicted in dotted lines, or not labeled for clarity of FIG. 4A. Memory cell 400A is an implementation based on memory cell 300A. In some embodiments, memory cell 400A is modifiable to be implemented based on memory cell 300B or memory cell 300C.

Memory cell 400A includes a plurality of conductive lines 302-328, 402, 404, 406, 412, 414, 422, and 424. Conductive lines 302-328 extend along direction Y in a first metal layer a chip in which memory cell 400A is formed in a manner illustrated above in conjunction with FIG. 3A. Conductive lines 402, 404, and 406 extend along direction X in a second metal layer over the first metal layer. Conductive lines 412 and 414 extend along direction Y in a third metal layer over the second metal layer. Conductive lines 422 and 424 extend along direction X in a fourth metal layer over the third metal layer. Memory cell 400A further includes a plurality of via plugs V1 in a first via layer connecting conductive lines of the first metal layer with corresponding conductive lines of the second metal layer; a plurality of via plugs V2 in a second via layer connecting conductive lines of the second metal layer with corresponding conductive lines of the third metal layer; and a plurality of via plugs V3 in a third via layer connecting conductive lines of the third metal layer with corresponding conductive lines of the fourth metal layer.

Conductive line 402 is a write word line electrically coupled with first write word line landing pad (conductive line 322) and second write word line landing pad (conductive line 324), which correspond to write word line nodes NWWL1 and NWW2. In some embodiments, conductive line 402 corresponds to write word line WWL in FIG. 1.

Conductive line 404 is a third read word line landing pad electrically coupled with first read word line landing pad (conductive line 326), which corresponds to read word line node NRWL1. Conductive line 406 is a fourth read word line landing pad electrically coupled with second read word line landing pad (conductive line 328), which corresponds to read word line node NRWL2.

Conductive line 412 is a fifth read word line landing pad electrically coupled with third read word line landing pad (conductive line 404), which corresponds to read word line node NRWL1. Conductive line 414 is a sixth read word line landing pad electrically coupled with fourth read word line landing pad (conductive line 406), which corresponds to read word line node NRWL2.

Conductive line 422 is a first read word line electrically coupled with fifth read word line landing pad (conductive line 412), which corresponds to read word line node NRWL1. Conductive line 424 is a second read word line electrically coupled with sixth read word line landing pad (conductive line 414), which corresponds to read word line node NRWL2. In some embodiments, conductive line 422 corresponds to read word line RWL1 in FIG. 1, and conductive line 424 corresponds to read word line RWL2.

In some embodiments, when two or more memory cells having a configuration of memory cell 400A are abutted along direction X, the conductive lines corresponding to conductive lines 402, 422, and 424 are extended or merged accordingly.

Figure 4B:
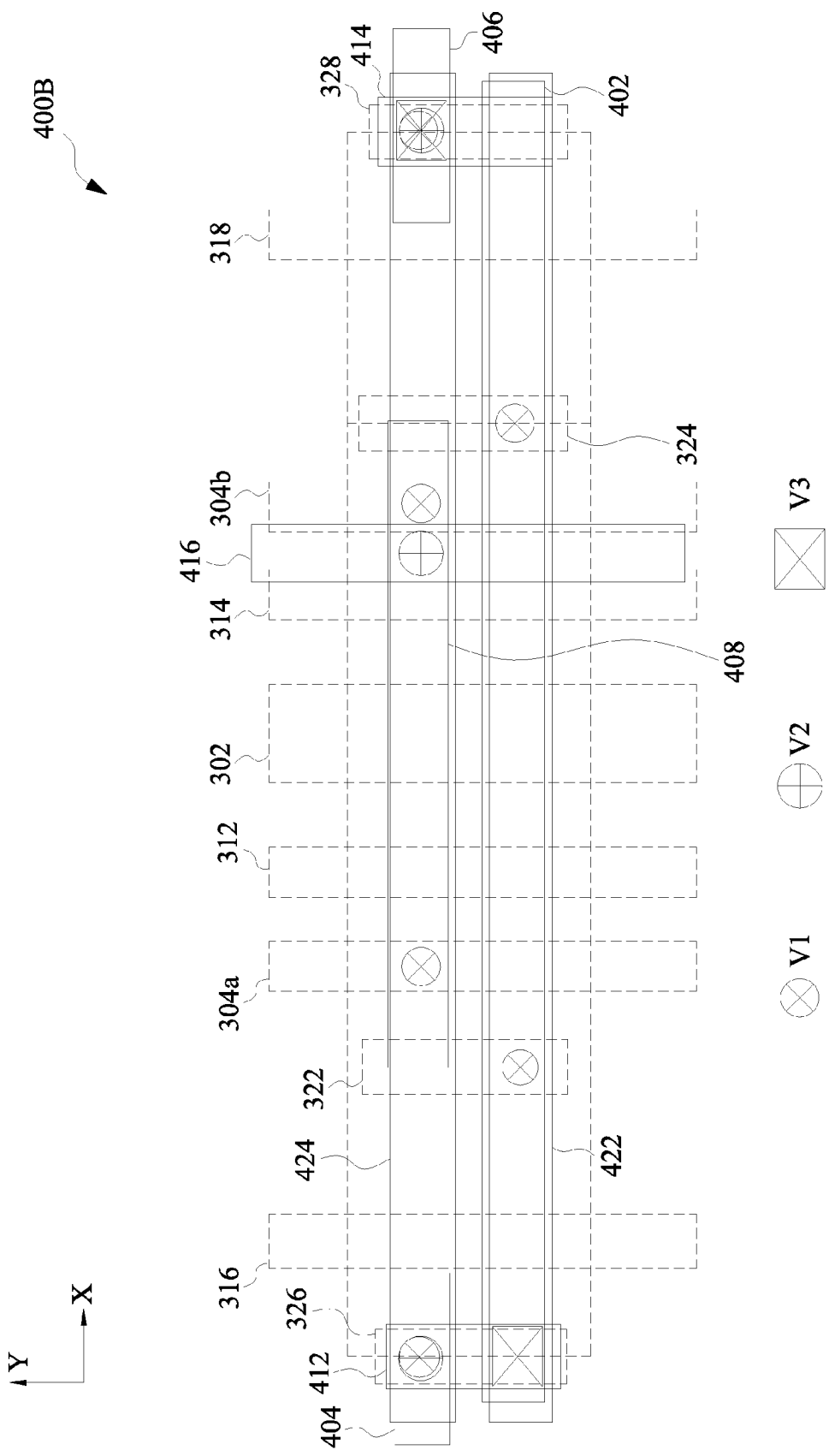

FIG. 4B is a top view of a memory cell 400B, with all the depictions regarding components over a fourth metal layer of a chip omitted, in accordance with some embodiments. The components in memory cell 400B that are the same or similar to those in memory cell 400A are given the same reference numbers, and detailed description thereof is thus omitted. Memory cell 400B is an implementation based on memory cell 300A. In some embodiments, memory cell 400B is modifiable to be implemented based on memory cell 300B or memory cell 300C.

Compared with memory cell 400A, memory cell 400B further includes conductive line 408 in the second metal layer and conductive line 416 in the third metal layer. Conductive line 408 is a reference voltage line electrically coupled with reference voltage lines 304a and 304b. Conductive line 416 is another reference voltage line electrically coupled with reference voltage line 408. In some embodiments, when two or more memory cells having a configuration of memory cell 400B are abutted along direction Y, the conductive lines corresponding to conductive line 416 are extended or merged accordingly.

Figure 4C:
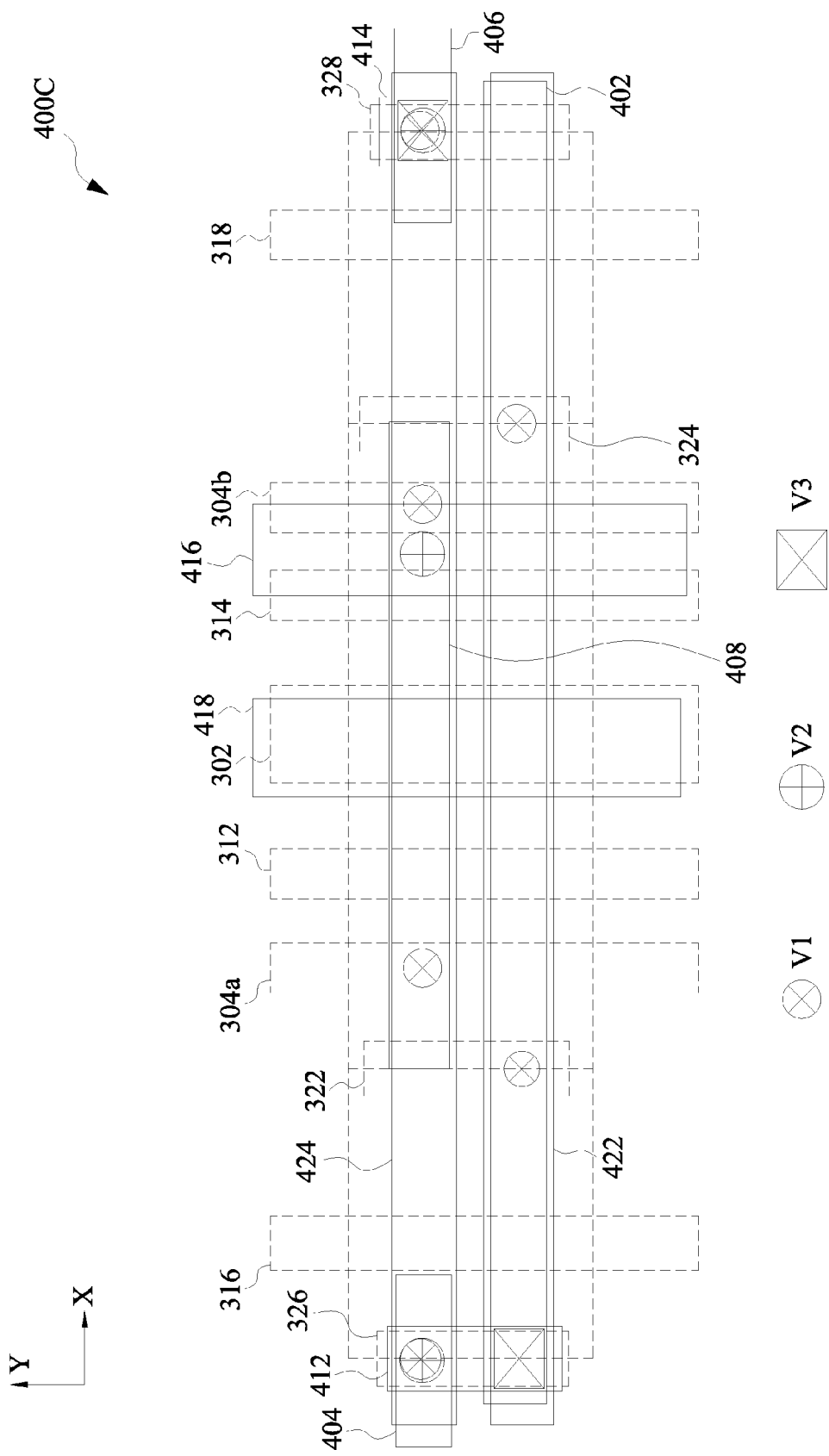

FIG. 4C is a top view of a memory cell 400C, with all the depictions regarding components over a fourth metal layer of a chip omitted, in accordance with some embodiments. The components in memory cell 400C that are the same or similar to those in memory cell 400B are given the same reference numbers, and detailed description thereof is thus omitted. Memory cell 400C is an implementation based on memory cell 300A. In some embodiments, memory cell 400C is modifiable to be implemented based on memory cell 300B or memory cell 300C.

Compared with memory cell 400B, memory cell 400C further includes conductive line 418 in the third metal layer. Conductive line 418 is a global supply voltage line electrically coupled with supply voltage nodes NVDD1 and NVDD2 of all memory cells abutted one another along the Y direction.

Figure 4D:
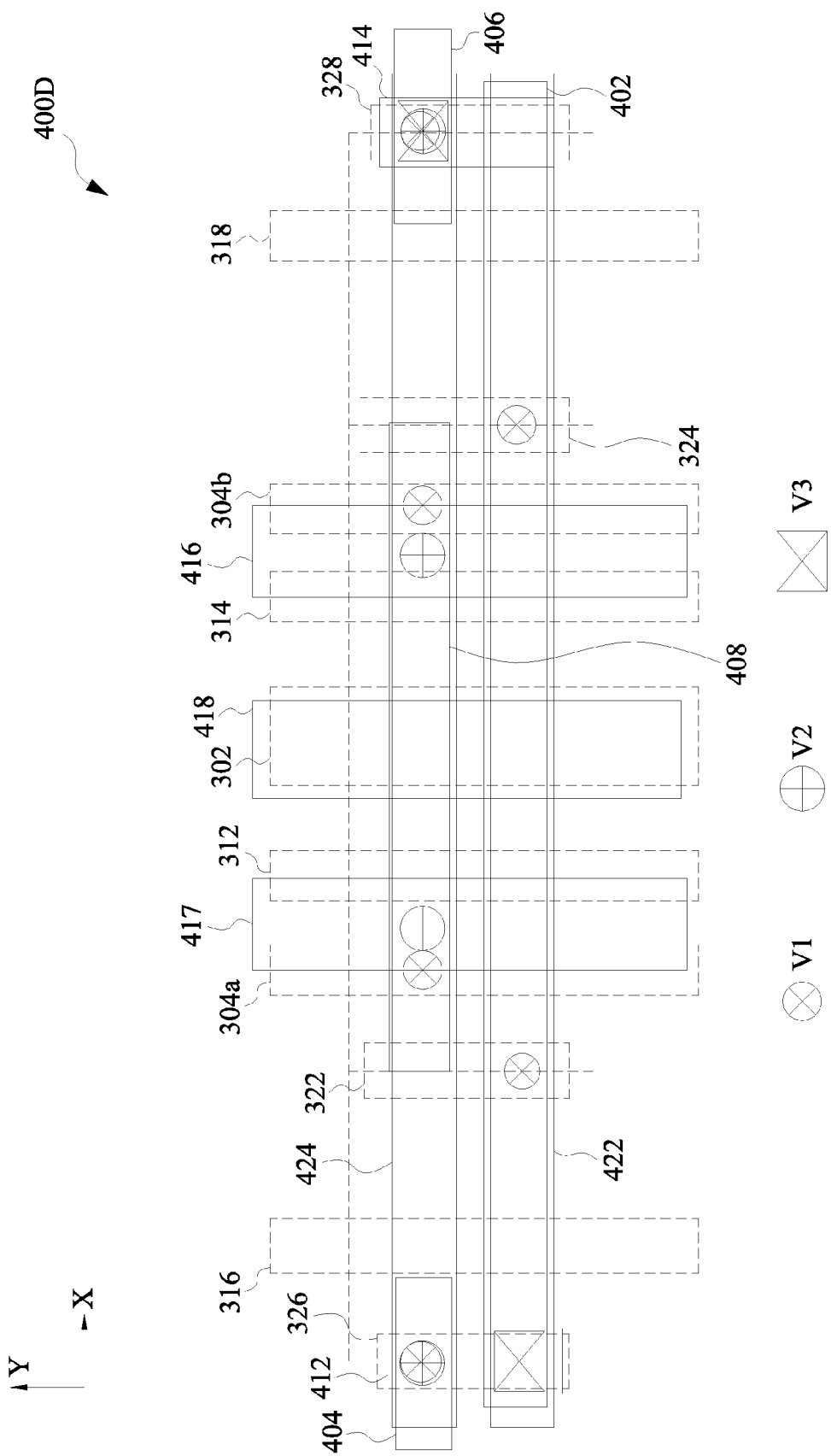

FIG. 4D is a top view of a memory cell 400D, with all the depictions regarding components over a fourth metal layer of a chip omitted, in accordance with some embodiments. The components in memory cell 400D that are the same or similar to those in memory cell 400C are given the same reference numbers, and detailed description thereof is thus omitted. Memory cell 400D is an implementation based on memory cell 300A. In some embodiments, memory cell 400D is modifiable to be implemented based on memory cell 300B or memory cell 300C.

Compared with memory cell 400C, memory cell 400D further includes conductive line 417 in the third metal layer. Conductive line 417 is yet another reference voltage line electrically coupled with reference voltage line 408. In some embodiments, when two or more memory cells having a configuration of memory cell 400D are abutted along direction Y, the conductive lines corresponding to conductive line 417 are also extended or merged accordingly. In some embodiments, conductive line 416 and conductive line 417 are placed symmetrically about conductive line 418.

Figure 5A:
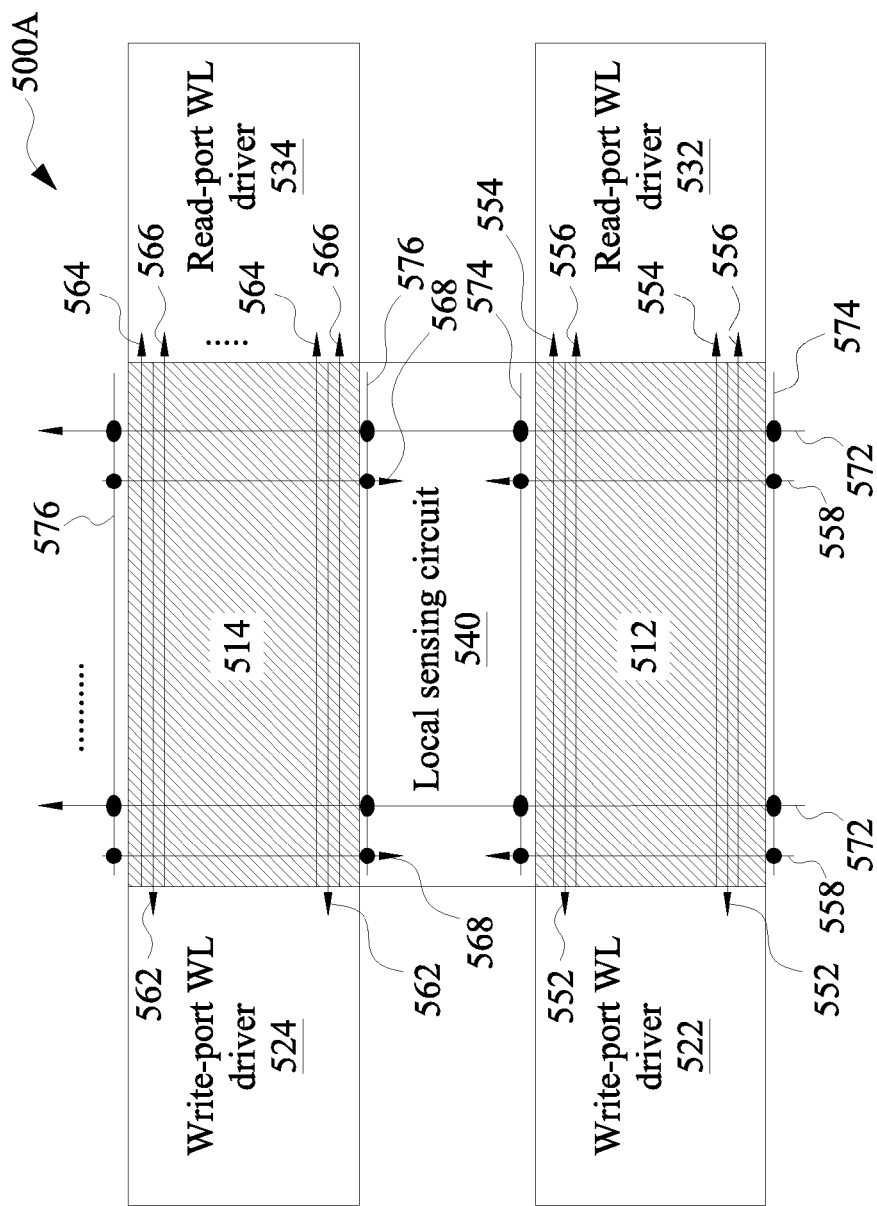
FIGS. 5A-5B are routing diagrams of various memory devices in accordance with some embodiments.

FIG. 5A is a routing diagram of a memory device 500A in accordance with some embodiments. Memory device 500A includes a first memory array 512, a second memory array 514, a first write-port word line driver 522 and a first read-port word line driver 532 coupled with first memory array 512, a second write-port word line driver 524 and a second read-port word line driver 534 coupled with second memory array 514, and a local sensing circuit 540 coupled with first memory array 512 and second memory array 514.

First memory array 512 and second memory array 514 each include a plurality of memory cells arranged into rows and columns. In some embodiments, the memory cells of first memory array 512 and second memory array 514 have a configuration similar to that of memory cell 400C or memory cell 400D.

First memory array 512 includes a plurality of write word lines 552 corresponding to write word line WWL of various memory cells of first memory array 512. Write-port word line driver 522 is configured to selectively enable one or more of write word lines 552 when writing a memory cell of first memory array 512. First memory array 512 includes a plurality of read word lines 554 corresponding to read word line RWL1 and a plurality of read word lines 556 corresponding to read word line RWL2 of various memory cells of first memory array 512. Read-port word line driver 532 is configured to selectively enable one or more of read word lines 555 and 556 when reading a memory cell of first memory array 512. First memory array 512 also includes supply voltage lines 558 in a first metal layer of a chip in which the memory device 500A is formed. Supply voltage lines 558 correspond to supply voltage line 302 of various memory cells of first memory array 512.

Second memory array 514 includes write word lines 562, read word lines 564, and read word lines 566 corresponding to write word lines 552, read word lines 554, and read word lines 556 of first memory array 512, and detailed description is thus omitted. Second memory array 514 also includes supply voltage lines 568 in the first metal layer of the chip. Supply voltage lines 568 correspond to supply voltage line 302 of various memory cells of first memory array 514.

Memory device 500A further includes supply voltage lines 572 in a third metal layer of the chip and supply voltage lines 574 and 576 a second metal layer of the chip. Supply voltage lines 572 correspond to supply voltage line 418 of various memory cells of first memory array 512 and second memory array 514. Supply voltage lines 574 are outside an area overlapping first memory array 512 and electrically couple supply voltage lines 572 with supply voltage lines 558 through corresponding via plugs. Supply voltage lines 576 are outside an area overlapping second memory array 514 and electrically couple supply voltage lines 572 with supply voltage lines 568 through corresponding via plugs.

In some embodiments, one or more conductive lines over the fourth metal layer are electrically coupled with supply voltage lines 572 to form a supply voltage mesh of the chip.

Figure 5B:
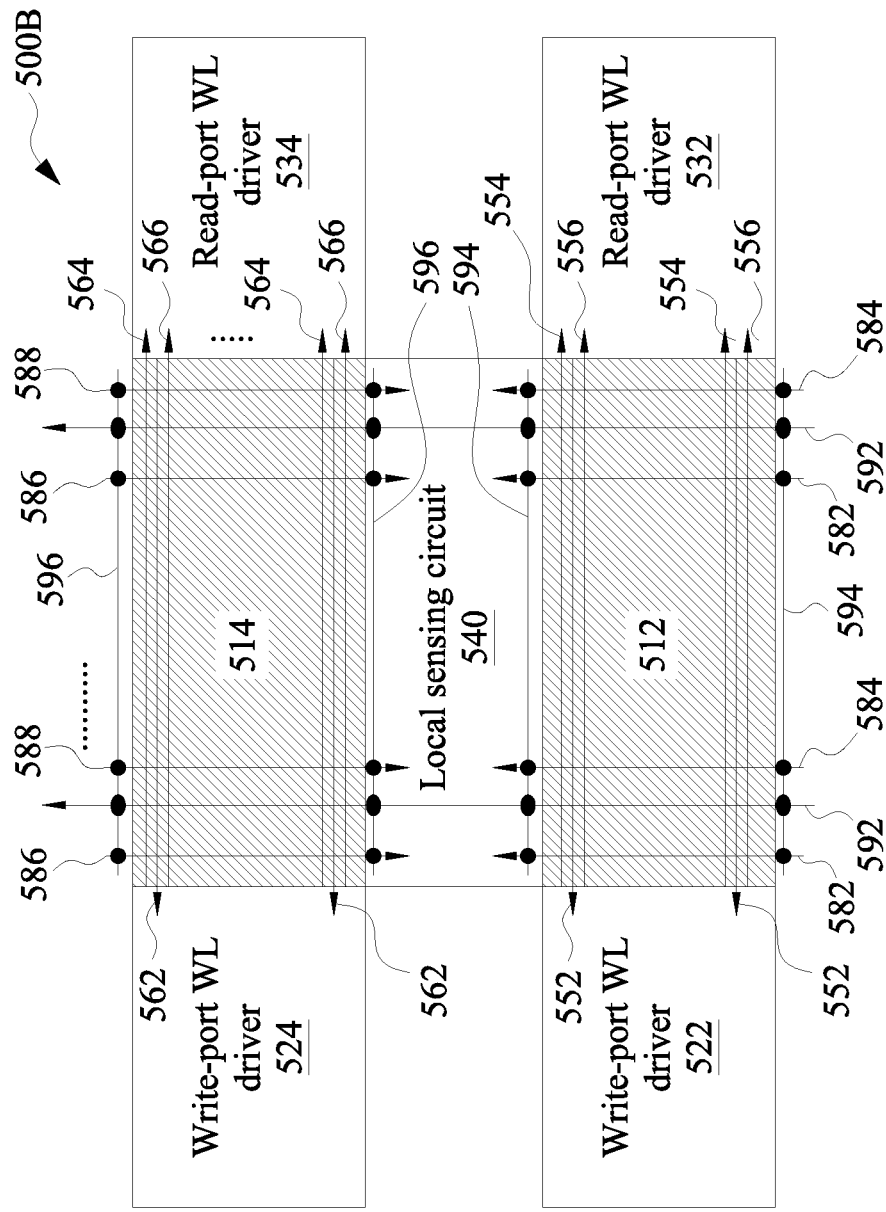

FIG. 5B is a routing diagram of a memory device 500B in accordance with some embodiments. Components of memory device 500B that are the same or similar to those in memory device 500A are given the same reference numbers, and detailed description thereof is thus omitted.

First memory array 512 includes reference voltage lines 582 and 584 in a first metal layer of a chip in which the memory device 500B is formed. Reference voltage lines 582 correspond to reference voltage line 304a and/or 304c (FIGS. 3A-3C) of various memory cells of first memory array 512. Reference voltage lines 584 correspond to reference voltage line 304b and/or 304d of various memory cells of first memory array 512.

First memory array 514 includes reference voltage lines 586 and 588 in the first metal layer of the chip. Reference voltage lines 586 correspond to reference voltage line 304a and/or 304c of various memory cells of first memory array 514. Reference voltage lines 588 correspond to reference voltage line 304b and/or 304d of various memory cells of first memory array 514.

Memory device 500B further includes reference voltage lines 592 in a third metal layer of the chip and reference voltage lines 594 and 596 a second metal layer of the chip. Reference voltage lines 592 correspond to reference voltage line 416 or reference line 417 various memory cells of first memory array 512 and second memory array 514, or one or more reference voltage lines different from reference voltage lines 416 and 417. Reference voltage lines 594 are outside an area overlapping first memory array 512 and electrically couple reference voltage lines 592 with reference voltage lines 582 and 584 through corresponding via plugs. Reference voltage lines 596 are outside an area overlapping second memory array 514 and electrically couple supply voltage lines 592 with supply voltage lines 586 and 588 through corresponding via plugs.

In some embodiments, one or more conductive lines over the fourth metal layer are electrically coupled with reference voltage lines 592 to form a reference voltage mesh of the chip.

Figure 6:
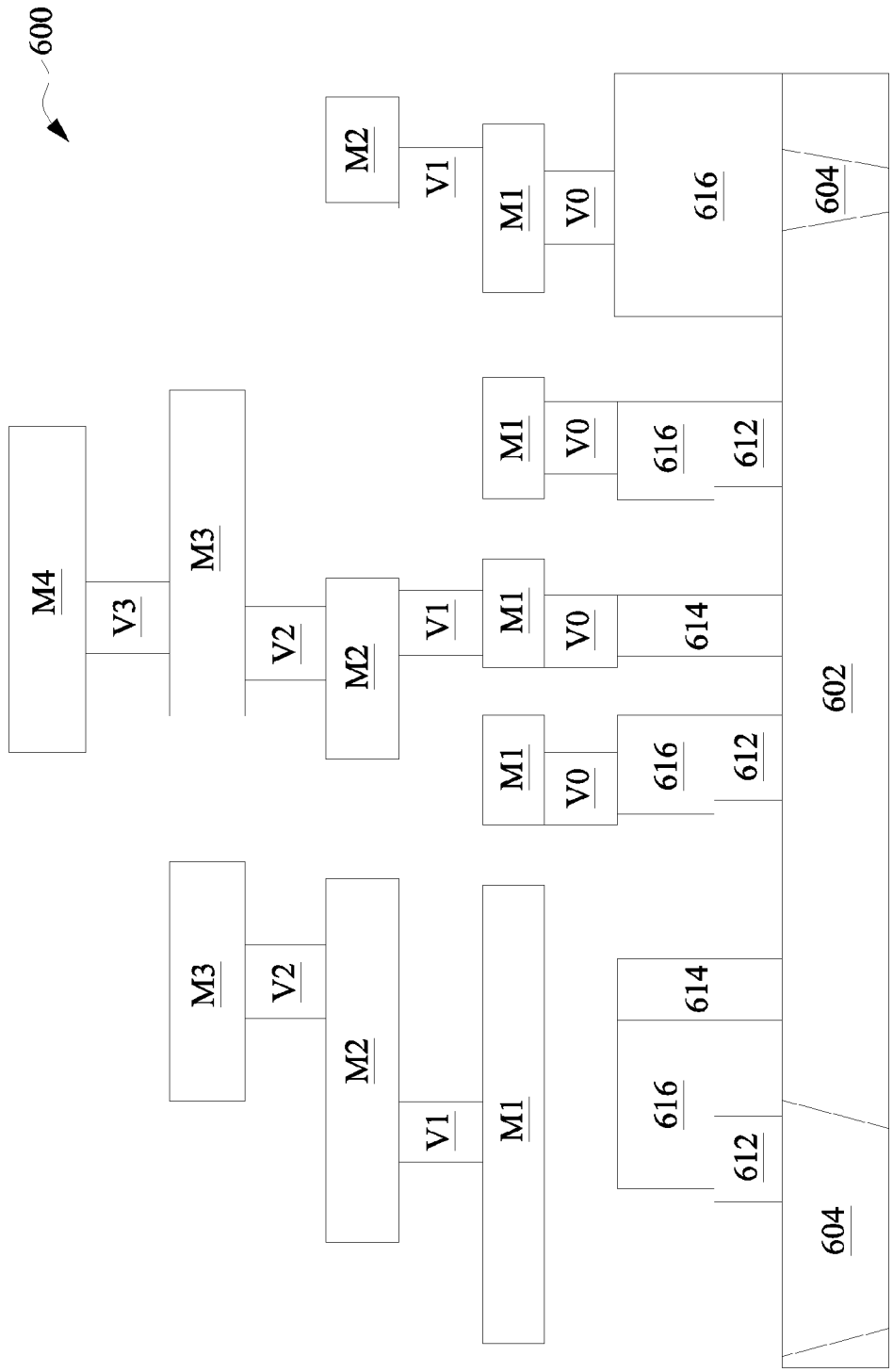
FIG. 6 is a cross-sectional view of a portion of a chip in accordance with some embodiments.

FIG. 6 is a cross-sectional view of a portion of a chip 600, in which one or more memory device as illustrated in the present application is formed, in accordance with some embodiments. Some components of chip 600 are not depicted for clarity of FIG. 6.

Chip 600 includes a substrate 602, various isolation features 604 buried in substrate 602, a plurality of gate structures 612 formed over substrate 602, a plurality of active contact structures 614 over substrate 602, and a plurality of gate contact structures 616 over various gate structures 612. Chip 600 also includes a plurality of conductive layers, which is also referred to as metal layers in this disclosure, and a plurality of via layers over substrate 602.

The conductive layers of chip 600 include a first metal layer having conductive features M1, a second metal layer having conductive features M2, a third metal layer having conductive features M3, and a fourth metal layer having conductive features M4. The via layers of chip 600 include a base via layer having via plugs V0, a first via layer having via plugs V1, a second via layer having via plugs V2, and a third via layer having via plug V3. Via plugs V0 are arranged to connect at least some of active conductive structures 614 and/or gate conductive structures 616 with corresponding first metal layer conductive features M1. Via plugs V1 are arranged to connect at least some first metal layer conductive features M1 with corresponding second metal layer conductive features M2. Via plugs V2 are arranged to connect at least some second metal layer conductive features M2 with corresponding third metal layer conductive features M3. Via plug V3 is arranged to connect a third metal layer conductive feature M3 with a corresponding fourth metal layer conductive feature M4.

FIG. 6 is used as to demonstrate the spatial relationship among carious metal layers and via layers. In some embodiments, the numbers of conductive features at various layers are not limited to the example depicted in FIG. 6. In some embodiments, there are one or more metal layers and one or more via layers over the fourth metal layer conductive structure M4.

Figure 7:
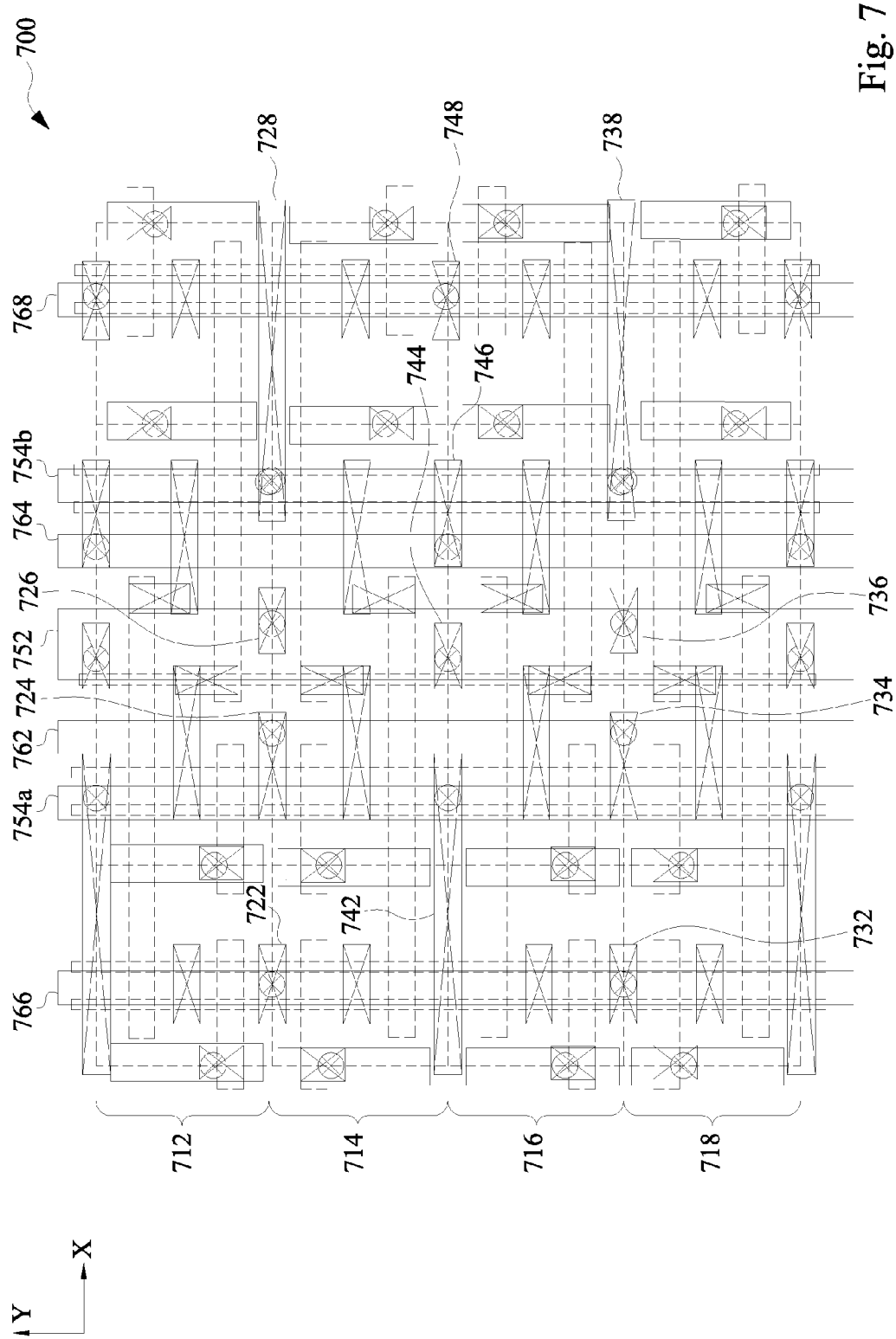
FIG. 7 is a top view of a portion of a memory device, with all the depictions regarding components in and above a first metal layer of a chip omitted, in accordance with some embodiments.

FIG. 7 is a top view of a portion of a memory device 700, with all the depictions regarding components in and above a first metal layer of a chip omitted, in accordance with some embodiments. In some embodiments, memory device 700 is usable to illustrate the abutment of various memory cells in memory array 512 or 514 in FIGS. 5A and 5B.

Memory device 700 includes four memory cells 712, 714, 716, and 718 abut one another along direction Y. Memory cells 712 and 716 are mirrored-identical to memory cell 300A in FIG. 3A, and memory cells 714 and 718 are identical to memory cell 300A. Reference numbers for components of memory cells 712, 714, 716, and 718 and detailed description thereof are thus omitted.

When memory cells 712, 714, 716, and 718 abut one another, active contact structures of memory cells 712 and 714 corresponding to active contact structures 262, 264, 258, and 254 are merged as active contact structures 722, 724, 726, and 728. Active contact structures of memory cells 716 and 718 corresponding to active contact structures 262, 264, 258, and 254 are merged as active contact structures 732, 734, 736, and 738. Also, active contact structures of memory cells 714 and 716 corresponding to active contact structures 252, 256, 268, and 266 are merged as active contact structures 742, 744, 746, and 748. Moreover, conductive lines of memory cells 712, 714, 716, and 718 corresponding to conductive lines 302, 304a, 304b, 312, 314, 316, and 318 are merged as conductive lines 752, 754a, 754b, 762, 764, 766, and 768.

Memory device 700 is implemented based on memory cell 300A. In some embodiments, memory cell 700 is modifiable to be implemented based on memory cell 300B or memory cell 300C.

FIG. 8A is a top view of a portion of a memory device 800A, with all the depictions regarding components over a fourth metal layer of a chip omitted, in accordance with some embodiments. In some embodiments, memory device 800A is implanted based on memory device 700 in FIG. 7 and usable to illustrate the abutment of various memory cells in memory array 512 or 514 in FIGS. 5A and 5B.

Memory device 800A includes four memory cells 812, 814, 816, and 818 abut one another along direction Y. Memory cells 812, 814, 816, and 818 variously correspond to memory cells 712, 714, 716, and 718. Memory cells 812 and 816 are mirrored-identical to memory cell 400A in FIG. 4A, and memory cells 814 and 818 are identical to memory cell 400A. Reference numbers for components of memory cells 812, 814, 816, and 818 and detailed description thereof are thus omitted.

Memory device 800A is implemented based on memory cell 400A. In some embodiments, memory cell 800A is modifiable to be implemented based on memory cell 400B, memory cell 400C, or memory cell 400D.

FIG. 8B is a top view of a portion of a memory device 800B, with all the depictions regarding components over a fourth metal layer of a chip omitted, in accordance with some embodiments. In some embodiments, memory device 800B is also implanted based on memory device 700 in FIG. 7 and usable to illustrate the abutment of various memory cells in memory array 512 or 514 in FIGS. 5A and 5B.

Memory device 800B includes four memory cells 822, 824, 826, and 828 abut one another along direction Y. Memory cells 822, 824, 826, and 828 variously correspond to memory cells 712, 714, 716, and 718. Compared with memory device 800A, memory cells 822, 824, 826, and 828 of memory device 800B are all identical to memory cell 400A. Reference numbers for components of memory cells 822, 824, 826, and 828 and detailed description thereof are thus omitted.

Memory device 800B is implemented based on memory cell 400A. In some embodiments, memory cell 800A is modifiable to be implemented based on memory cell 400B, memory cell 400C, or memory cell 400D.

In some embodiments in a memory device, the memory cell abutment is arranged based on the arrangement depicted in FIG. 8A, based on the arrangement depicted in FIG. 8B, or a combination thereof.

Figure 9:
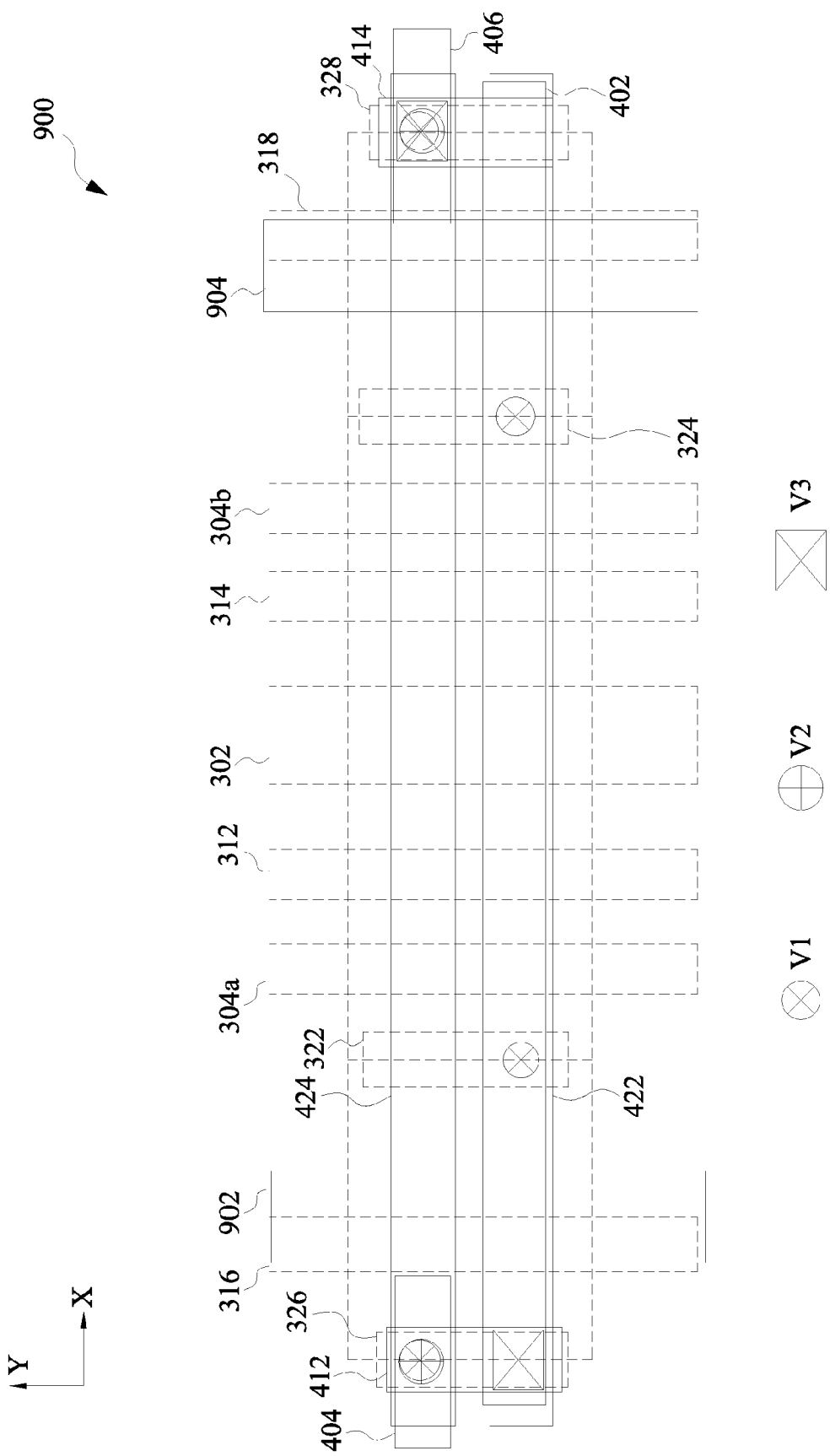
FIG. 9 is a top view of a memory cell, with all the depictions regarding components in and above a fourth metal layer of a chip omitted, in accordance with some embodiments.

FIG. 9 is a top view of a memory cell 900, with all the depictions regarding components in and above a fourth metal layer of a chip omitted, in accordance with some embodiments. The components in memory cell 900 that are the same or similar to those in memory cell 400A are given the same reference numbers, and detailed description thereof is thus omitted. Memory cell 900 is an implementation based on memory cell 300A. In some embodiments, memory cell 900 is modifiable to be implemented based on memory cell 300B or memory cell 300C.

Compared with memory cell 400A, memory cell 900 further includes conductive lines 902 and 904 in the third metal layer. Conductive line 902 overlaps first read port area II and functions as a first global read bit line corresponding to the first read port circuit of memory cell 900. Conductive line 904 overlaps second read port area III and functions as a second global read bit line corresponding to the second read port circuit of memory cell 900.

Figure 10:
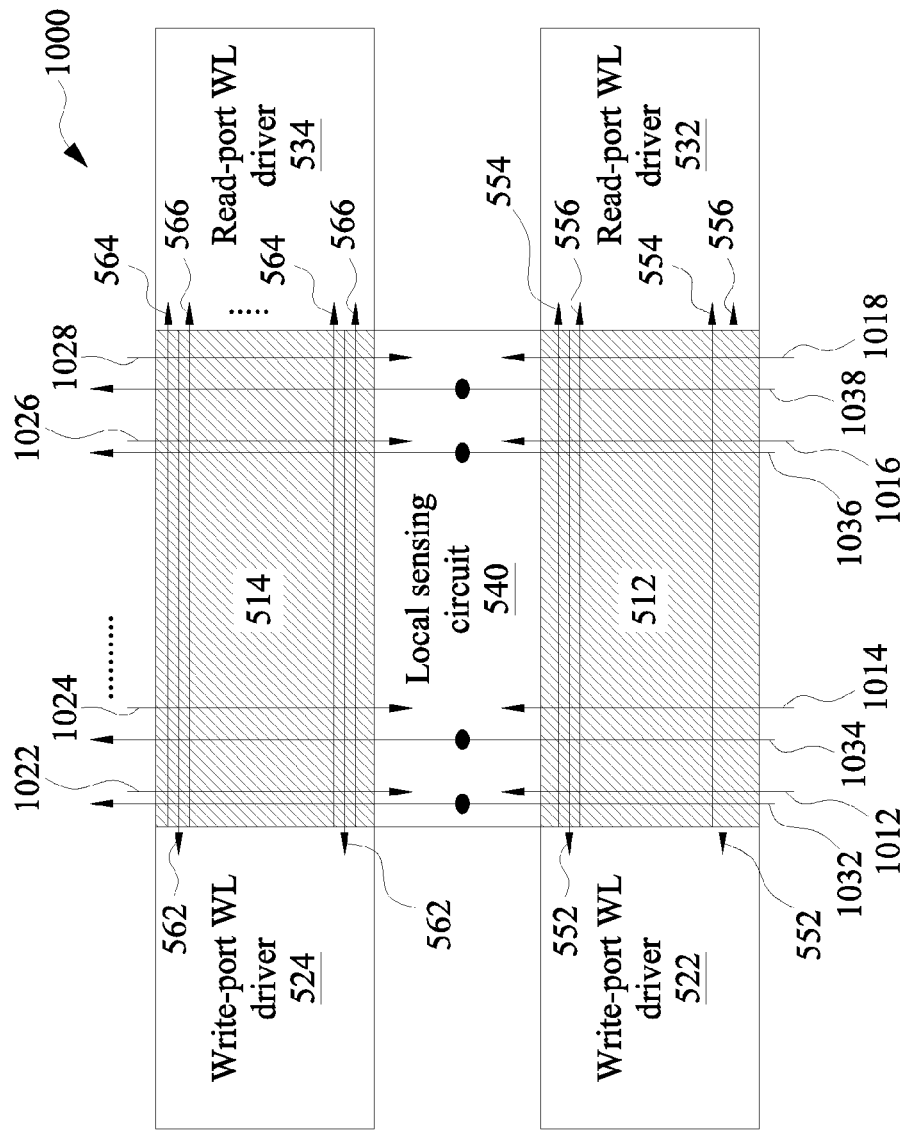
FIG. 10 is a routing diagram of a portion of a memory device in accordance with some embodiments.

FIG. 10 is a routing diagram of a portion of a memory device 1000 in accordance with some embodiments. Memory device 1000 is implemented based on memory cell 900. Components of memory device 1000 that are the same or similar to those in memory device 500A are given the same reference numbers, and detailed description thereof is thus omitted.

First memory array 512 includes conductive lines 1012, 1014, 1016, and 1018 in a first metal layer of a chip in which the memory device 1000 is formed. Conductive line 1012 and conductive line 1014 correspond to read bit lines 316 and 318 (FIGS. 3A-3C) of a column of memory cells of first memory array 512. Conductive line 1016 and conductive line 1018 correspond to read bit lines 316 and 318 of another column of memory cells of first memory array 512. Conductive lines 1012, 1014, 1016, and 1018 electrically couple corresponding columns of memory cells of first memory array 512 with local sensing circuit 540.

Second memory array 514 includes conductive lines 1022, 1024, 1026, and 1028 in the first metal layer. Conductive line 1022 and conductive line 1024 correspond to read bit lines 316 and 318 of a column of memory cells of second memory array 514. Conductive line 1026 and conductive line 1028 correspond to read bit lines 316 and 318 of another column of memory cells of second memory array 514. Conductive lines 1022, 1024, 1026, and 1028 electrically couple corresponding columns of memory cells of second memory array 514 with local sensing circuit 540.

Memory device 1000 further includes global read bit lines 1032, 1034, 1036, and 1038 in a third metal layer of the chip. Global read bit line 1032 is electrically coupled with local sensing circuit 540 and corresponds to conductive line 902 of a column of memory cells of first memory array 512 and a column of memory cells of second memory array 514. Global read bit line 1034 is electrically coupled with local sensing circuit 540 and corresponds to conductive line 904 of the column of memory cells of first memory array 512 and the column of memory cells of second memory array 514. Global read bit line 1036 is electrically coupled with local sensing circuit 540 and corresponds to conductive line 902 of another column of memory cells of first memory array 512 and another column of memory cells of second memory array 514. Global read bit line 1038 is electrically coupled with local sensing circuit 540 and corresponds to conductive line 904 of the another column of memory cells of first memory array 512 and the another column of memory cells of second memory array 514.

Figure 11A:
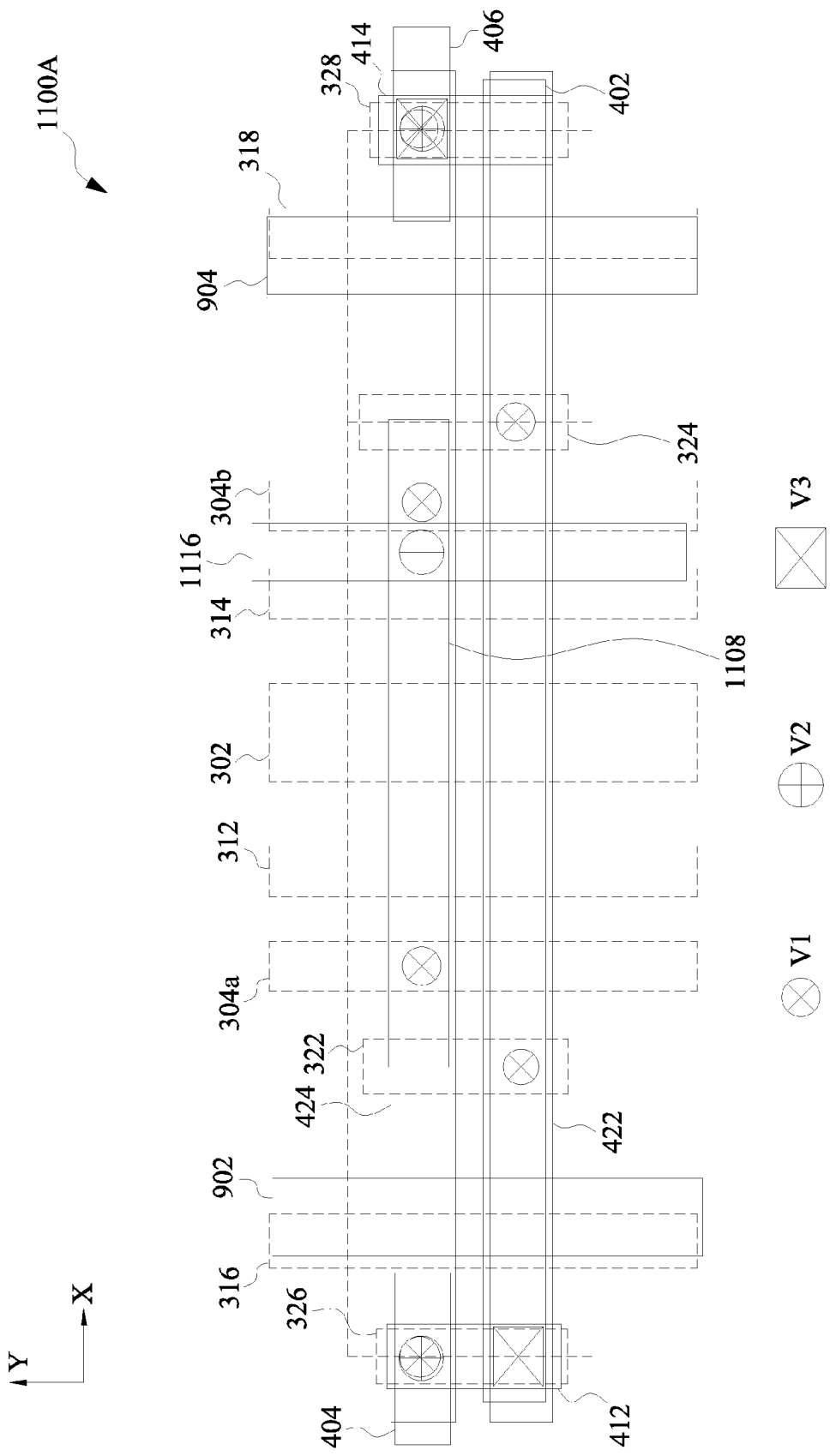
FIGS. 11A-11C are top views of various memory cells, with all the depictions regarding components over a fourth metal layer of a chip omitted, in accordance with some embodiments.

FIG. 11A is a top view of a memory cell 1100A, with all the depictions regarding components over a fourth metal layer of a chip omitted, in accordance with some embodiments. The components in memory cell 1100A that are the same or similar to those in memory cell 900 are given the same reference numbers, and detailed description thereof is thus omitted. Memory cell 1100A is an implementation based on memory cell 300A. In some embodiments, memory cell 1100A is modifiable to be implemented based on memory cell 300B or memory cell 300C.

Compared with memory cell 900, memory cell 1100A further includes conductive line 1108 in the second metal layer and conductive line 1116 in the third metal layer. Conductive line 1108 is a reference voltage line corresponding to conductive line 408 in FIG. 4B. Conductive line 1116 is a reference voltage line corresponding to conductive line 416 in FIG. 4B. Detailed description of conductive lines 1108 and 1116 is thus omitted. In some embodiments, a memory device using memory cells 1100A has a configuration having the features of memory device 500A and memory device 1000.

Figure 11B:
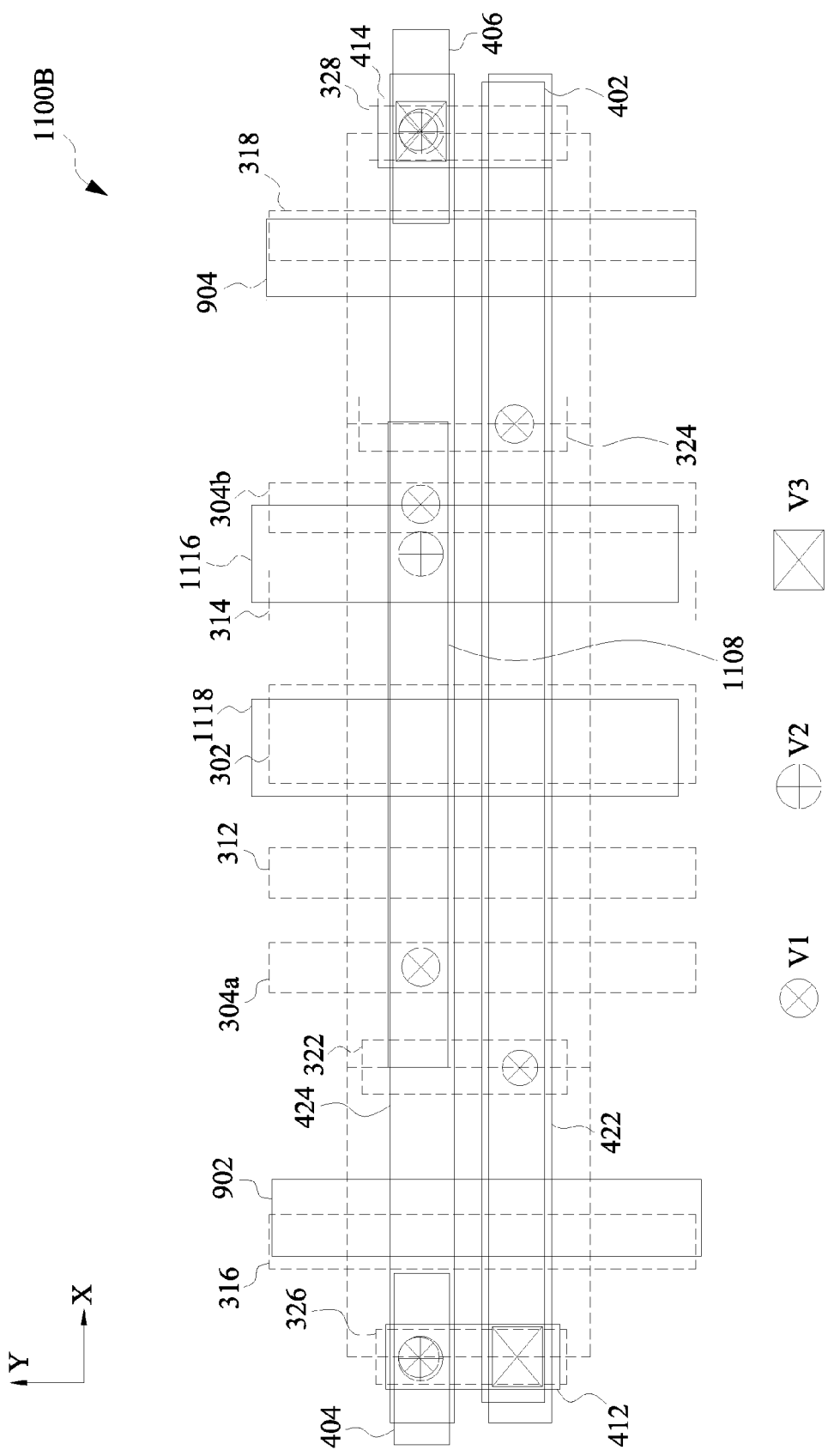

FIG. 11B is a top view of a memory cell 1100B, with all the depictions regarding components over a fourth metal layer of a chip omitted, in accordance with some embodiments. The components in memory cell 1100B that are the same or similar to those in memory cell 1100A are given the same reference numbers, and detailed description thereof is thus omitted. Memory cell 1100B is an implementation based on memory cell 300A. In some embodiments, memory cell 1100B is modifiable to be implemented based on memory cell 300B or memory cell 300C.

Compared with memory cell 1100A, memory cell 1100B further includes conductive line 1118 in the third metal layer. Conductive line 1118 is a global supply voltage line corresponding to conductive line 418 in FIG. 4C. Detailed description of conductive line 1118 is thus omitted. In some embodiments, a memory device using memory cells 1100B has a configuration having the features of memory device 1000 and one or more of memory device 500A and memory device 500B.

Figure 11C:
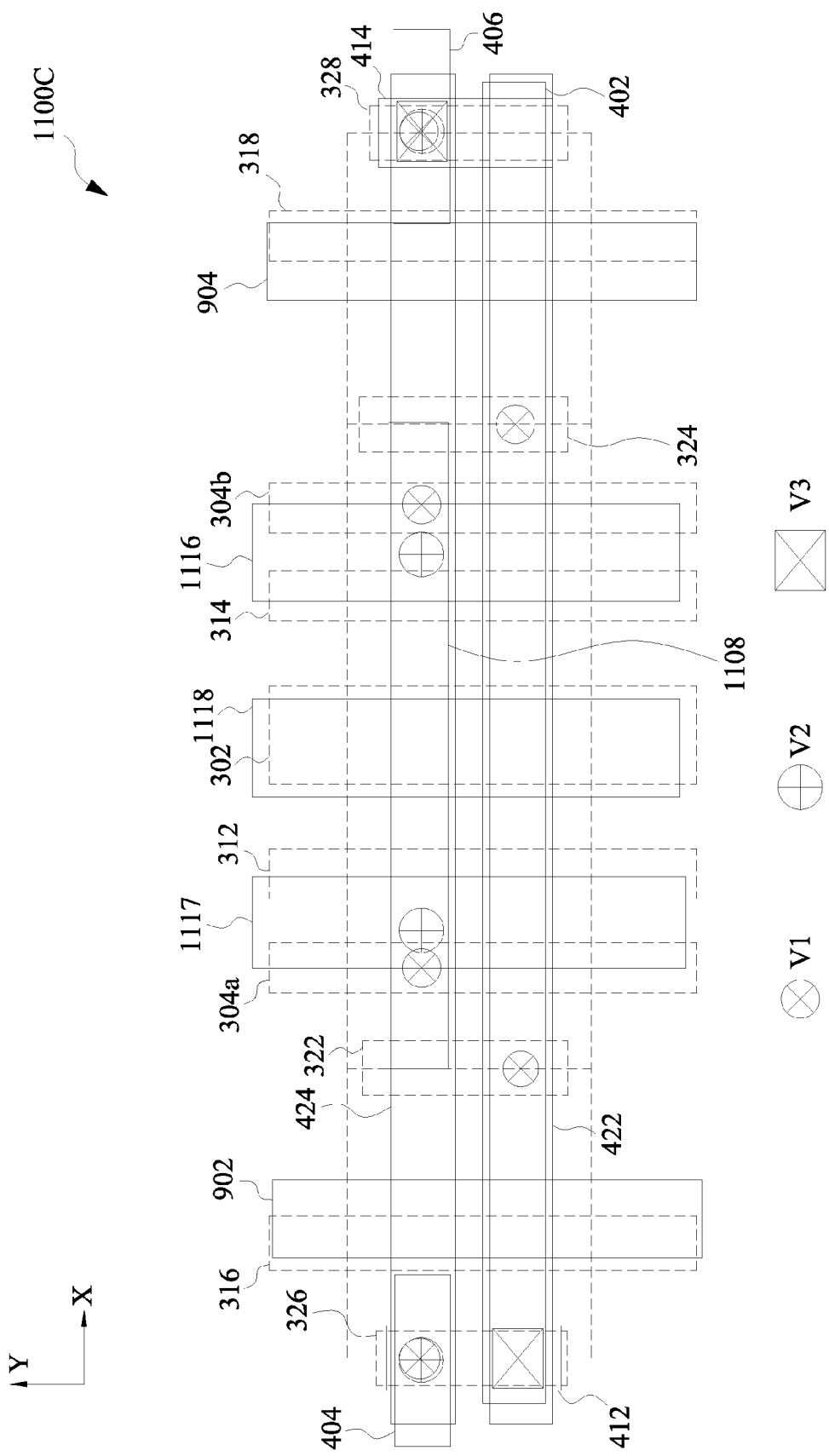

FIG. 11C is a top view of a memory cell 1100C, with all the depictions regarding components over a fourth metal layer of a chip omitted, in accordance with some embodiments. The components in memory cell 1100C that are the same or similar to those in memory cell 1100B are given the same reference numbers, and detailed description thereof is thus omitted. Memory cell 1100C is an implementation based on memory cell 300A. In some embodiments, memory cell 1100C is modifiable to be implemented based on memory cell 300B or memory cell 300C.

Compared with memory cell 1100B, memory cell 1100C further includes conductive line 1117 in the third metal layer.

Conductive line 1117 is a reference voltage line corresponding to conductive line 417 in FIG. 4D. Detailed description of conductive line 1117 is thus omitted. In some embodiments, a memory device using memory cells 1100C has a configuration having the features of memory device 1000 and one or more of memory device 500A and memory device 500B.

Figure 12:
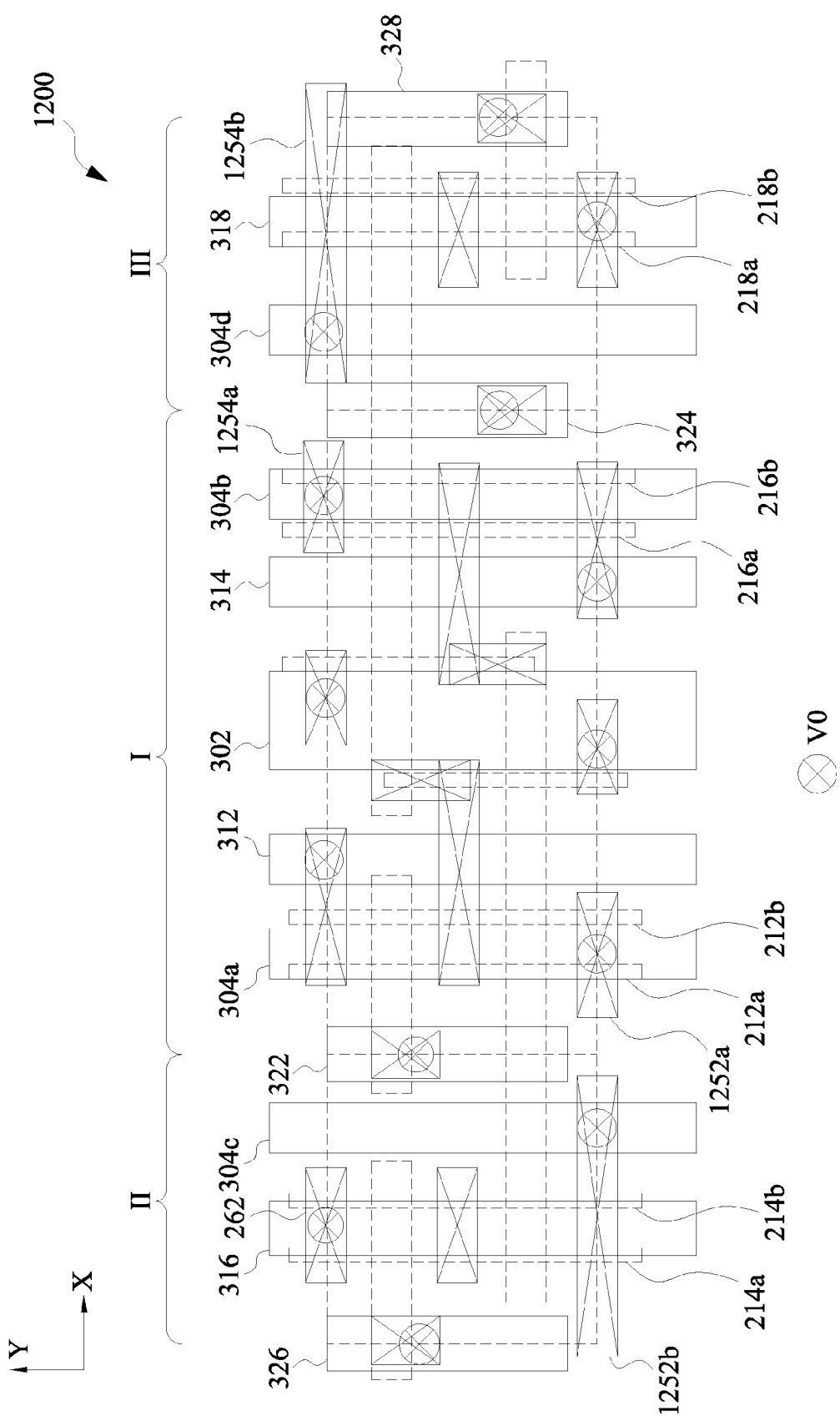
FIG. 12 is a top view of a memory cell, with all the depictions regarding components over a first metal layer of a chip omitted, in accordance with some embodiments.

FIG. 12 is a top view of a memory cell 1200, with all the depictions regarding components over a first metal layer of a chip omitted, in accordance with some embodiments. The components in memory cell 1200 that are the same or similar to those in memory cell 300C are given the same reference numbers, and detailed description thereof is thus omitted. Some components of memory cell 1200 that are the same or similar to those in memory cell 300A, 300B, or 300C are not labeled for clarity of FIG. 12. In some embodiments, memory cell 1200 is an implementation of memory cell 100 depicted in FIG. 1 having components as depicted in FIG. 2. In some embodiments, the configurations illustrated in conjunction with FIGS. 4A-11C are also applicable to memory cell 1200.

Compared with memory cell 300C, memory cell 1200 includes active contact structures 1252a and 1252b in place of active structure 252, and active contact structures 1254a and 1254b in place of active structure 254.

Active contact structures 1252a and 1254a overlap storage/write port area I. Active contact structure 1252a overlaps active structures 212a and 212b and corresponds to a source of transistor N1 and reference voltage nodes NVSS1. Active contact structure 1254a overlaps active structures 216a and 216b and corresponds to a source of transistor N2 and reference voltage nodes NVSS2. Conductive line 304a is electrically coupled with active contact structure 1252a, and conductive line 304b is electrically coupled with active contact structure 1254a.

Active contact structure 1252b overlaps first read port area II. Active contact structure 1252b overlaps active structures 214a and 214b and corresponds to a source of transistor N5 and reference voltage nodes NVSS3. Active contact structure 1254b overlaps second read port area III. Active contact structure 1254b overlaps active structures 218a and 218b and corresponds to a source of transistor N7 and reference voltage nodes NVSS4.

Figure 13A:
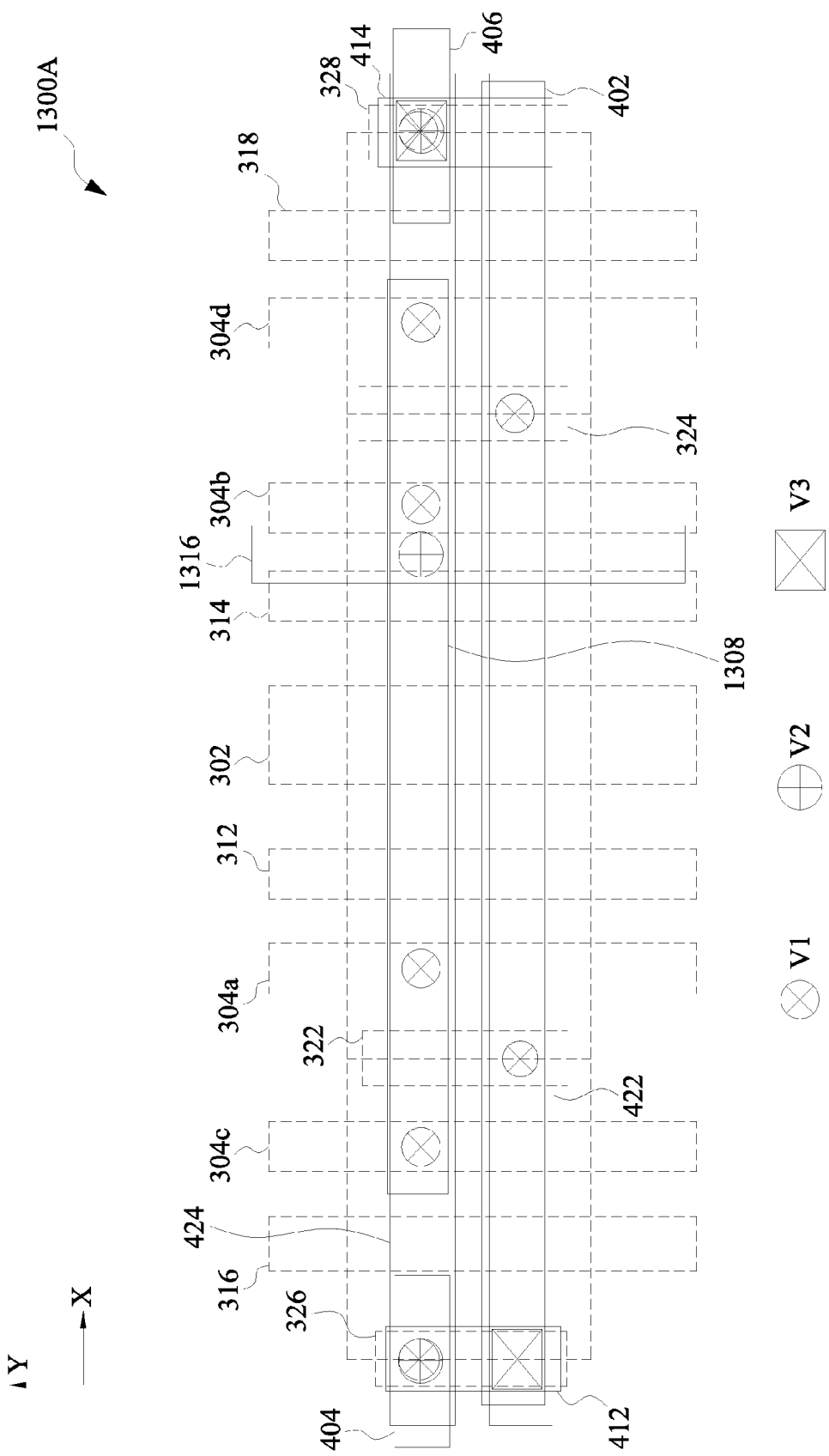
FIGS. 13A-13C are top views of various memory cells, with all the depictions regarding components over a fourth metal layer of a chip omitted, in accordance with some embodiments.

FIG. 13A is a top view of a memory cell 1300A, with all the depictions regarding components over a fourth metal layer of a chip omitted, in accordance with some embodiments. The components in memory cell 1300A that are the same or similar to those in memory cell 1200 in FIG. 12 and memory cell 400A in FIG. 4A are given the same reference numbers, and detailed description thereof is thus omitted. Memory cell 1300A is an implementation based on memory cell 1200. In some embodiments, memory cell 1300A is modifiable to be implemented based on memory cell 300C in FIG. 3C.

Compared with memory cell 400A, memory cell 1300A further includes conductive line 1308 in the second metal layer and conductive line 1316 in the third metal layer. Conductive line 1308 is a reference voltage line corresponding to conductive line 408 in FIG. 4B. Conductive line 1308 is electrically coupled with reference voltage lines 304a, 304b, 304c, and 304d through corresponding via plugs V1 in the first via layer. Conductive line 1316 is a reference voltage line corresponding to conductive line 416 in FIG. 4B. Conductive line 1316 is electrically coupled with conductive line 1318 through a corresponding via plug V2 in the second via layer. In some embodiments, a memory device using memory cells 1300A has a configuration having the features of memory device 500A.

Figure 13B:
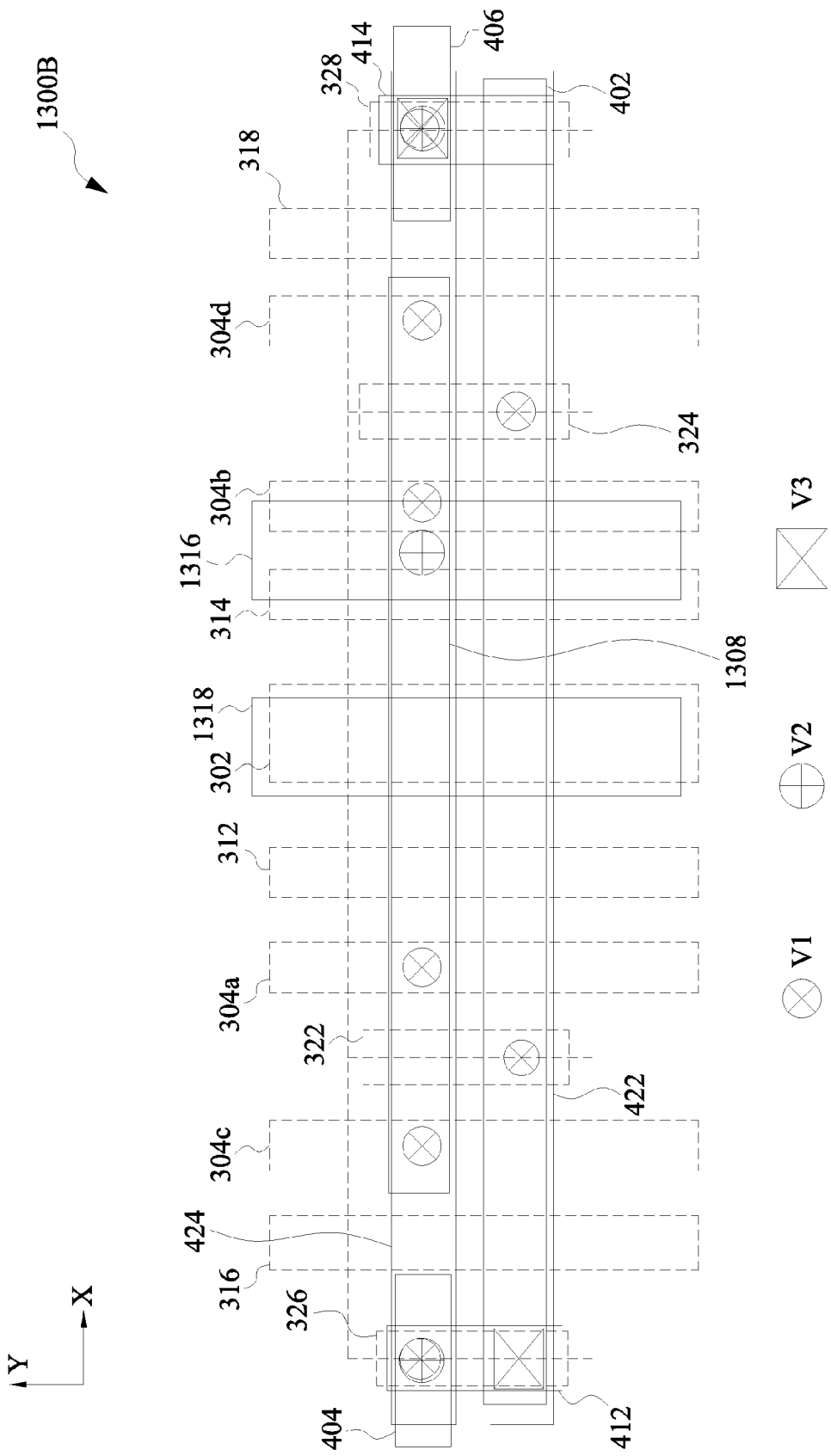

FIG. 13B is a top view of a memory cell 1300B, with all the depictions regarding components over a fourth metal layer of a chip omitted, in accordance with some embodiments. The components in memory cell 1300B that are the same or similar to those in memory cell 1300A are given the same reference numbers, and detailed description thereof is thus omitted. Memory cell 1300B is an implementation based on memory cell 1200. In some embodiments, memory cell 1300B is modifiable to be implemented based on memory cell 300C.

Compared with memory cell 1300A, memory cell 1300B further includes conductive line 1318 in the third metal layer. Conductive line 1318 is a global supply voltage line corresponding to conductive line 418 in FIG. 4C. Detailed description of conductive line 1318 is thus omitted. In some embodiments, a memory device using memory cells 1300B has a configuration having the features of memory device 500A or memory device 500B.

Figure 13C:
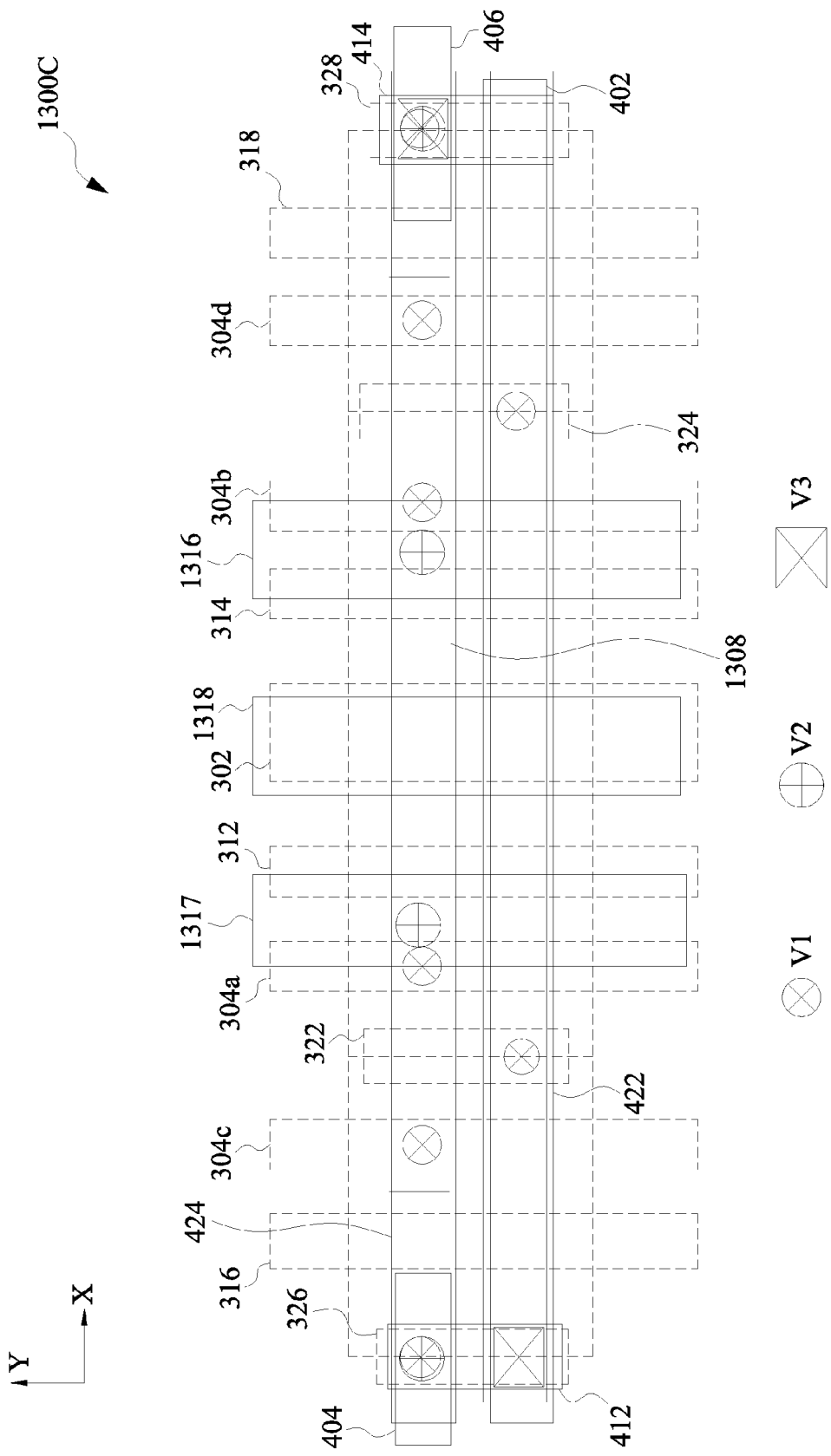

FIG. 13C is a top view of a memory cell 1300C, with all the depictions regarding components over a fourth metal layer of a chip omitted, in accordance with some embodiments. The components in memory cell 1300C that are the same or similar to those in memory cell 1300B are given the same reference numbers, and detailed description thereof is thus omitted. Memory cell 1300C is an implementation based on memory cell 1200. In some embodiments, memory cell 1300C is modifiable to be implemented based on memory cell 300C.

Compared with memory cell 1300B, memory cell 1300C further includes conductive line 1317 in the third metal layer. Conductive line 1317 is a reference voltage line corresponding to conductive line 417 in FIG. 4D. Detailed description of conductive line 1317 is thus omitted. In some embodiments, a memory device using memory cells 1300C has a configuration having the features of memory device 500A or memory device 500B.

The configurations described above are illustrated as individual examples. In some embodiments, a memory cell or a memory device is implemented by adopting the features of one or more of the individual examples illustrated above.

In accordance with one embodiment, a static random access memory (SRAM) cell in a chip includes a storage circuit having a first data node, a second data node, a supply voltage node, and a first reference voltage node; a write port circuit coupled with the first data node and having a first write word line node and a first write bit line node; a first read port circuit coupled with the first data node and having a first read word line node, a first read bit line node, and a second reference voltage node; a second read port circuit coupled with the second data node and having a second read word line node, a second read bit line node, and a third reference voltage node; and a plurality of conductive lines. The plurality of conductive lines includes a plurality of first conductive lines extending along a first direction in a first metal layer of the chip, a plurality of second conductive lines extending along a second direction in a second metal layer of the chip and over the first metal layer, a plurality of third conductive lines extending along the first direction in a third metal layer of the chip and over the second metal layer, and a plurality of fourth conductive lines extending along the second direction in a fourth metal layer of the chip and over the third metal layer. The plurality of first conductive lines includes a first supply voltage line electrically coupled with the supply voltage node; a first reference voltage line electrically coupled with the first reference voltage node; a first write bit line electrically coupled with the first write bit line node; a first read bit line electrically coupled with the first read bit line node; and a second read bit line electrically coupled with the second read bit line node. The plurality of second conductive lines includes a write word line electrically coupled with the first write word line node. The plurality of fourth conductive lines includes a first read word line electrically coupled with the first read word line node; and a second read word line electrically coupled with the second read word line node.

In accordance with another embodiment, a memory circuit in a chip, includes a memory array comprising a plurality of static random access memory (SRAM) cells arranged into rows and columns, a plurality of first conductive lines extending along a first direction in a first metal layer of the chip, a plurality of second conductive lines extending along a second direction in a second metal layer of the chip and over the first metal layer, a plurality of third conductive lines extending along the first direction in a third metal layer of the chip and over the second metal layer, and a plurality of fourth conductive lines extending along the second direction in a fourth metal layer of the chip and over the third metal layer. Each SRAM cell includes a supply voltage node, a first reference voltage node, a write port having a write word line node and a write bit line node, a first read port having a first read word line node, a first read bit line node, and a second reference voltage node, and a second read port having a second read word line node, a second read bit line node, and a third reference voltage node. The plurality of first conductive lines includes a first supply voltage line electrically coupled with the supply voltage nodes of a first column of SRAM cells of the memory array; a first reference voltage line electrically coupled with the first reference voltage nodes of the first column of SRAM cells of the memory array; a first write bit line electrically coupled with the first write bit line nodes of the first column of SRAM cells of the memory array; a first read bit line electrically coupled with the first read bit line nodes of the first column of SRAM cells of the memory array; and a second read bit line electrically coupled with the second read bit line nodes of the first column of SRAM cells of the memory array. The plurality of second conductive lines includes a write word line electrically coupled with the first write word line nodes of a row of SRAM cells of the memory array. The plurality of fourth conductive lines includes a first read word line electrically coupled with the first read word line nodes of the row of SRAM cells of the memory array; and a second read word line electrically coupled with the second read word line nodes of the row of SRAM cells of the memory array.

In accordance with another embodiment, a static random access memory (SRAM) cell in a chip, includes a first plurality of transistors configured as a storage circuit, a second plurality of transistors configured as a write port circuit, a third plurality of transistors configured as a first read port circuit, a fourth plurality of transistors configured as a second read port circuit, a plurality of first conductive lines extending along a first direction in a first metal layer of the chip, a plurality of second conductive lines extending along a second direction in a second metal layer of the chip and over the first metal layer, a plurality of third conductive lines in a third metal layer of the chip and over the second metal layer, and a plurality of fourth conductive lines extending along the second direction in a fourth metal layer of the chip and over the third metal layer. The storage circuit has a first data node and a second data node. The write port circuit is coupled with the first data node and the second data node and has a first write word line node, a second write word line node, a first write bit line node, and a second write bit line node. The first read port circuit is coupled with the first data node and has a first read word line node and a first read bit line node. The second read port circuit is coupled with the second data node and has a second read word line node and a second read bit line node. The plurality of first conductive lines includes a first write bit line electrically coupled with the first write bit line node; a second write bit line electrically coupled with the second write bit line node; a first read bit line electrically coupled with the first read bit line node; and a second read bit line electrically coupled with the second read bit line node. The plurality of second conductive lines includes a write word line electrically coupled with the first and second write word line nodes. The plurality of fourth conductive lines includes a first read word line electrically coupled with the first read word line node; and a second read word line electrically coupled with the second read word line node. The SRAM cell has a cell height along the first direction and a cell width along the second direction, and a ratio of the cell width to the cell height being equal to or greater than 5.

Various types of transistors are discussed in this disclosure as example. In some embodiments, the implementations using other types of transistors different from those illustrated in the present disclosure are within the scope of the subject application.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell in a chip, comprising:
   a storage circuit having a first data node, a second data node, a supply voltage node, and a first reference voltage node;
   a write port circuit coupled with the first data node and having a first write word line node and a first write bit line node;
   a first read port circuit coupled with the first data node and having a first read word line node, a first read bit line node, and a second reference voltage node;
   a second read port circuit coupled with the second data node and having a second read word line node, a second read bit line node, and a third reference voltage node;
   a plurality of first conductive lines extending along a first direction in a first metal layer of the chip, the plurality of first conductive lines comprising:
      a first supply voltage line electrically coupled with the supply voltage node;
      a first reference voltage line electrically coupled with the first reference voltage node;
      a first write bit line electrically coupled with the first write bit line node;
      a first read bit line electrically coupled with the first read bit line node; and a second read bit line electrically coupled with the second read bit line node;
a plurality of second conductive lines extending along a second direction in a second metal layer of the chip and over the first metal layer, the plurality of second conductive lines comprising:
a write word line electrically coupled with the first write word line node;
a plurality of third conductive lines extending along the first direction in a third metal layer of the chip and over the second metal layer; and
a plurality of fourth conductive lines extending along the second direction in a fourth metal layer of the chip and over the third metal layer, the plurality of fourth conductive lines comprising:
a first read word line electrically coupled with the first read word line node; and
a second read word line electrically coupled with the second read word line node.

2. The SRAM cell of claim 1, wherein the plurality of first conductive lines further comprises a first write word line landing pad electrically coupled with the first write word line node and the write word line.

3. The SRAM cell of claim 1, further comprising a via plug in a first via layer of the chip, the via plug directly connecting the first write word line landing pad and the write word line.

4. The SRAM cell of claim 1, wherein the plurality of first conductive lines further comprises a second write word line landing pad electrically coupled with the first write word line node and the write word line.

5. The SRAM cell of claim 4, further comprising a via plug in a first via layer of the chip, the via plug directly connecting the second write word line landing pad and the write word line.

6. The SRAM cell of claim 1, wherein
the plurality of first conductive lines further comprises:
a second reference voltage line electrically coupled with the first reference voltage node.

7. The SRAM cell of claim 1, wherein
the plurality of first conductive lines further comprises:
a second reference voltage line electrically coupled with the second reference voltage node; and
a third reference voltage line electrically coupled with the third reference voltage node.

8. The SRAM cell of claim 1, further comprising:
a first conductive structure under the first metal layer of the chip, the first conductive structure extending along the first direction and electrically coupling the first reference node with the second reference node; and
a second conductive structure under the first metal layer of the chip, the second conductive structure extending along the first direction and electrically coupling the first reference node with the third reference node.

9. The SRAM cell of claim 1, wherein
the plurality of first conductive lines further comprises:
a first read word line landing pad electrically coupled with the first read word line node; and
a second read word line landing pad electrically coupled with the second read word line node;
the plurality of second conductive lines further comprises:
a third read word line landing pad electrically coupled with the first read word line landing pad; and
a fourth read word line landing pad electrically coupled with the second read word line landing pad; and
the plurality of third conductive lines comprising:
a fifth read word line landing pad electrically coupled with the third read word line landing pad and the first read word line; and
a sixth read word line landing pad electrically coupled with the fourth read word line landing pad and the second read word line.

10. The SRAM cell of claim 9, further comprising:
a plurality of via plugs in a first via layer of the chip, the plurality of via plugs variously connecting
the first read word line landing pad and the third read word line landing pad;
the second read word line landing pad and the fourth read word line landing pad;
the third read word line landing pad and the fifth read word line landing pad;
the fourth read word line landing pad and the sixth read word line landing pad;
the fifth read word line landing pad and the first read word line; and
the sixth read word line landing pad and the second read word line.

11. The SRAM cell of claim 1, wherein the SRAM cell has a cell height along the first direction and a cell width along the second direction, and a ratio of the cell width to the cell height being equal to or greater than 5.

12. The SRAM cell of claim 1, wherein the plurality of third conductive lines further comprises:
a second supply voltage line electrically coupled with the supply voltage node.

13. The SRAM cell of claim 1, wherein
the plurality of second conductive lines further comprises:
a second reference voltage line electrically coupled with the first reference voltage line;
the plurality of third conductive lines further comprises:
a third reference voltage line electrically coupled with the second reference voltage line.

14. A memory circuit in a chip, comprising:
a memory array comprising a plurality of static random access memory (SRAM) cells arranged into rows and columns, each SRAM cell comprises:
a supply voltage node;
a first reference voltage node;
a write port having a write word line node and a write bit line node;
a first read port having a first read word line node, a first read bit line node, and a second reference voltage node; and
a second read port having a second read word line node, a second read bit line node, and a third reference voltage node;
a plurality of first conductive lines extending along a first direction in a first metal layer of the chip, the plurality of first conductive lines comprising:
a first supply voltage line electrically coupled with the supply voltage nodes of a first column of SRAM cells of the memory array;
a first reference voltage line electrically coupled with the first reference voltage nodes of the first column of SRAM cells of the memory array;
a first write bit line electrically coupled with the first write bit line nodes of the first column of SRAM cells of the memory array;
a first read bit line electrically coupled with the first read bit line nodes of the first column of SRAM cells of the memory array; and a second read bit line electrically coupled with the second read bit line nodes of the first column of SRAM cells of the memory array;

a plurality of second conductive lines extending along a second direction in a second metal layer of the chip and over the first metal layer, the plurality of second conductive lines comprising:
 a write word line electrically coupled with the first write word line nodes of a row of SRAM cells of the memory array;

a plurality of third conductive lines extending along the first direction in a third metal layer of the chip and over the second metal layer; and a plurality of fourth conductive lines extending along the second direction in a fourth metal layer of the chip and over the third metal layer, the plurality of fourth conductive lines comprising:
 a first read word line electrically coupled with the first read word line nodes of the row of SRAM cells of the memory array; and
 a second read word line electrically coupled with the second read word line nodes of the row of SRAM cells of the memory array.

15. The memory circuit of claim 14, wherein
the plurality of first conductive lines further comprises:
 a second supply voltage line electrically coupled with the supply voltage nodes of a second column of SRAM cells of the memory array;
the plurality of second conductive lines further comprises:
 a third supply voltage line outside an area overlapping the memory array, the third supply voltage line electrically coupled with the first supply voltage line and the second supply voltage line; and
the plurality of third conductive lines comprises:
 a fourth supply voltage line electrically coupled with the third supply voltage line.

16. The memory circuit of claim 14, wherein
the plurality of second conductive lines further comprises:
 a second reference voltage line electrically coupled with the first reference voltage line;
the plurality of third conductive lines further comprises:
 a third reference voltage line electrically coupled with the second reference voltage line.

17. The memory circuit of claim 14, wherein
the plurality of first conductive lines further comprises:
 a fourth reference voltage line electrically coupled with the reference voltage nodes of a second column of SRAM cells of the memory array;
the plurality of second conductive lines further comprises:
 a fifth reference voltage line outside an area overlapping the memory array, the fifth reference voltage line electrically coupled with the first reference voltage line and the second reference voltage line; and
the third reference voltage line is electrically coupled with the fifth reference voltage line.

18. The memory circuit of claim 14, further comprising:
a sensing circuit electrically coupled with the first read bit line and a second read bit line,
wherein the plurality of third conductive lines further comprises:
 a first global bit line corresponding to the first column of SRAM cells of the memory array and electrically coupled with the sensing circuit; and
 a second global bit line corresponding to the first column of SRAM cells of the memory array and electrically coupled with the sensing circuit.

19. A static random access memory (SRAM) cell in a chip, comprising:
a first plurality of transistors configured as a storage circuit, the storage circuit having a first data node and a second data node;
a second plurality of transistors configured as a write port circuit, the write port circuit being coupled with the first data node and the second data node and having a first write word line node, a second write word line node, a first write bit line node, and a second write bit line node;
a third plurality of transistors configured as a first read port circuit, the first read port circuit being coupled with the first data node and having a first read word line node and a first read bit line node;
a fourth plurality of transistors configured as a second read port circuit, the second read port circuit being coupled with the second data node and having a second read word line node and a second read bit line node;
a plurality of first conductive lines extending along a first direction in a first metal layer of the chip, the plurality of first conductive lines comprising:
 a first write bit line electrically coupled with the first write bit line node;
 a second write bit line electrically coupled with the second write bit line node;
 a first read bit line electrically coupled with the first read bit line node; and
 a second read bit line electrically coupled with the second read bit line node;
a plurality of second conductive lines extending along a second direction in a second metal layer of the chip and over the first metal layer, the plurality of second conductive lines comprising:
 a write word line electrically coupled with the first and second write word line nodes;
a plurality of third conductive lines in a third metal layer of the chip and over the second metal layer; and
a plurality of fourth conductive lines extending along the second direction in a fourth metal layer of the chip and over the third metal layer, the plurality of fourth conductive lines comprising:
 a first read word line electrically coupled with the first read word line node; and
 a second read word line electrically coupled with the second read word line node,
wherein the SRAM cell has a cell height along the first direction and a cell width along the second direction, and a ratio of the cell width to the cell height being equal to or greater than 5.

20. The SRAM cell of claim 19, wherein
the storage circuit further having a supply voltage node, a first reference voltage node, and a second reference voltage node; and
the plurality of first conductive lines further comprises:
 a supply voltage line electrically coupled with the supply voltage node;
 a first reference voltage line electrically coupled with the third reference voltage node; and
 a second reference voltage line electrically coupled with the third reference voltage node.

\* \* \* \* \*